(12) United States Patent
Chang et al.

(10) Patent No.: US 12,745,413 B2
(45) Date of Patent: Sep. 22, 2026

(54) SYSTEM AND METHODS OF MANUFACTURING SEMICONDUCTOR DEVICES

(71) Applicant: Taiwan Semiconductor Manufacturing Co., Ltd., Hsinchu (TW)

(72) Inventors: Chia-Ao Chang, Jinhu Township (TW); Pei-Ren Jeng, Chu-Bei City (TW); Chii-Horng Li, Zhubei City (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 210 days.

(21) Appl. No.: 18/446,738

(22) Filed: Aug. 9, 2023

(65) Prior Publication Data

US 2023/0387273 A1 Nov. 30, 2023

Related U.S. Application Data

(62) Division of application No. 17/236,535, filed on Apr. 21, 2021, now Pat. No. 12,087,845.

(51) Int. Cl.

*H10D 30/01* (2025.01)
*H10D 84/01* (2026.01)
*H10D 84/03* (2025.01)
*H10P 72/00* (2026.01)

(52) U.S. Cl.

CPC ..... *H10D 30/0243* (2025.01); *H10D 84/0158* (2025.01); *H10D 84/038* (2025.01); *H10P 72/0402* (2026.01)

(58) Field of Classification Search

CPC ........... H10D 30/0243; H10D 84/0158; H10D 84/038

See application file for complete search history.

(56) References Cited

U.S. PATENT DOCUMENTS 9,093,530 B2 7/2015 Huang et al.
9,171,929 B2 10/2015 Lee et al.
9,214,555 B2 12/2015 Oxland et al.
9,236,267 B2 1/2016 De et al.

(Continued)

FOREIGN PATENT DOCUMENTS

CN 112687625 A 4/2021

OTHER PUBLICATIONS

Wyller, G. M., et al., "Identification of higher order silanes during monosilane pyrolysis using gas chromatography-mass spectrometry," Journal of Crystal Growth, 498 (2018), pp. 315-327.

*Primary Examiner* — Christine A Enad
(74) *Attorney, Agent, or Firm* — Slater Matsil, LLP

(57) ABSTRACT

A system and methods of manufacturing semiconductor devices is described herein. The method includes forming a recess between fins in a substrate and forming a dielectric layer over the fins and in the recess. Once the dielectric layer has been formed, a bottom seed structure is formed over the dielectric layer within the recess and the dielectric layer is exposed along sidewalls of the recess. A dummy gate material is grown from the bottom seed structure in a bottom-up deposition process without growing the dummy gate material from the dielectric layer exposed along sidewalls of the recess.

20 Claims, 26 Drawing Sheets

(56) References Cited

U.S. PATENT DOCUMENTS

| | | | | |
|---|---|---|---|---|
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 2014/0048865 | A1* | 2/2014 | Toh | H10D 64/691<br>257/E21.423 |
| 2019/0157156 | A1* | 5/2019 | Chen | H10D 84/038 |
| 2020/0044048 | A1* | 2/2020 | Yu | H10D 64/017 |
| 2020/0105589 | A1* | 4/2020 | Tsai | H10D 62/822 |
| 2020/0144397 | A1 | 5/2020 | Dube et al. | |
| 2020/0365454 | A1 | 11/2020 | Kao et al. | |
| 2020/0381289 | A1* | 12/2020 | Yeong | H10D 62/151 |
| 2021/0119013 | A1 | 4/2021 | Chen et al. | |
| 2021/0358865 | A1 | 11/2021 | Tokranov et al. | |
| 2022/0199458 | A1 | 6/2022 | Makowski et al. | |

* cited by examiner

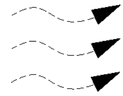
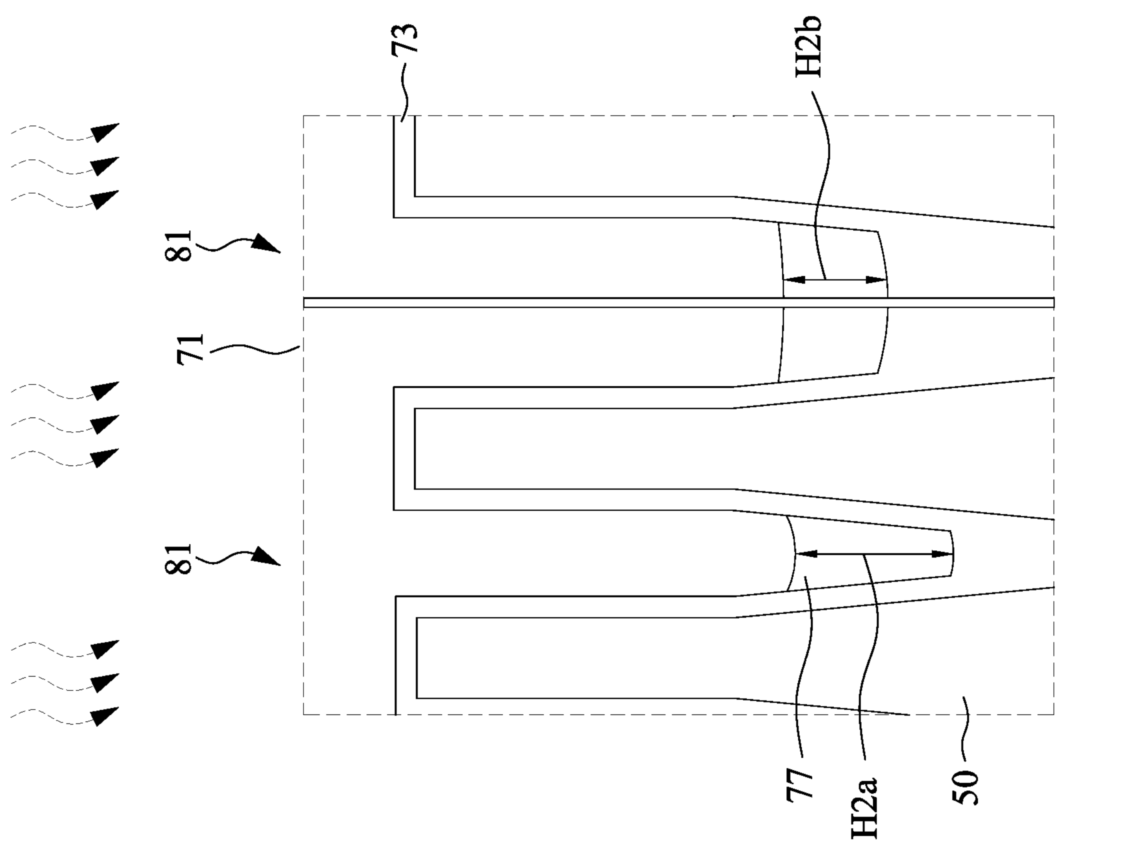
Fig. 8
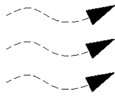
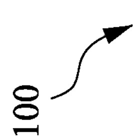

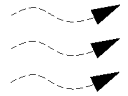
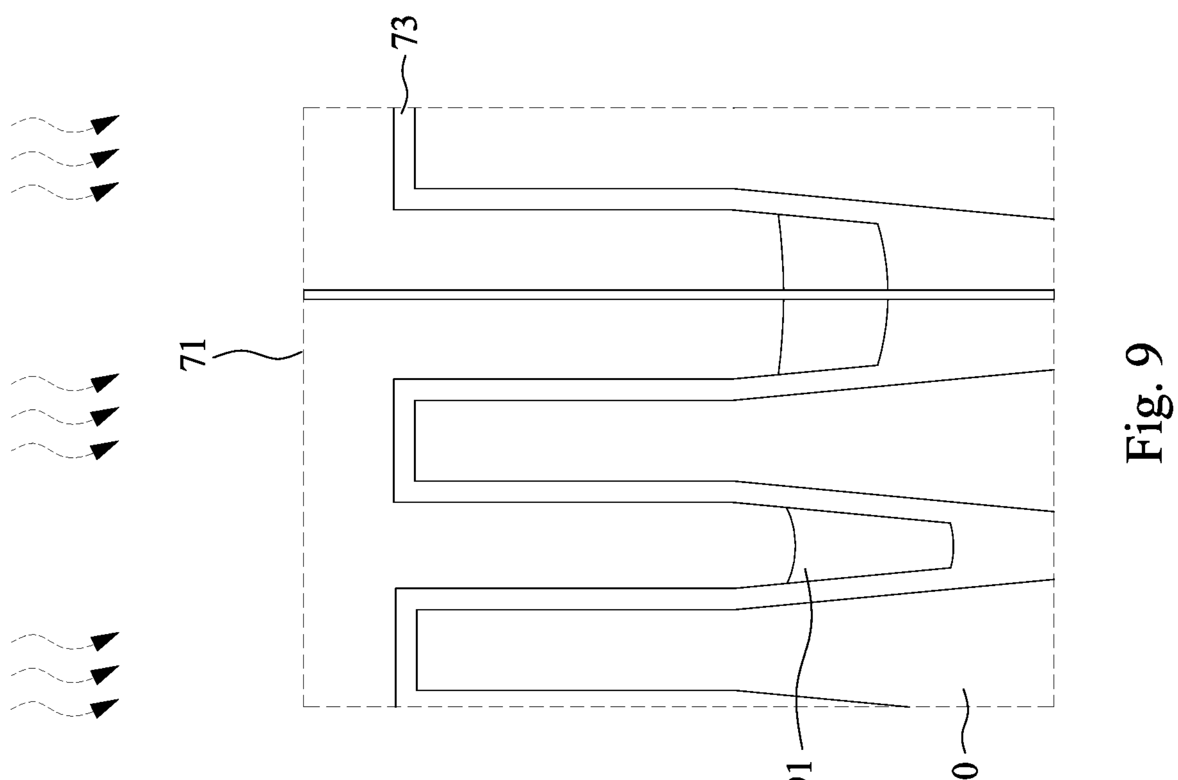
Fig. 9
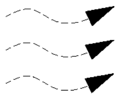
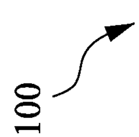

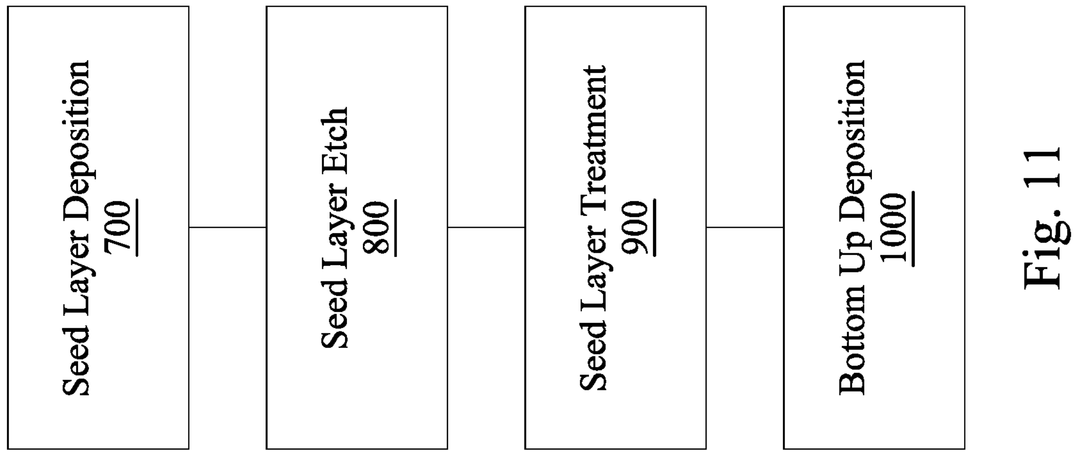
Fig. 11

SYSTEM AND METHODS OF MANUFACTURING SEMICONDUCTOR DEVICES

PRIORITY CLAIM AND CROSS-REFERENCE

This application is a divisional of U.S. patent application Ser. No. 17/236,535, filed on Apr. 21, 2021, now U.S. Pat. No. 12,087,845, issued Sep. 10, 2024, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 10A-10B are cross-sectional views of intermediate stages in the manufacturing of FinFETs, in accordance with some embodiments.

FIG. 11 is a flowchart of the gap-filling process, according to some embodiments.

DETAILED DESCRIPTION

Figure 1:
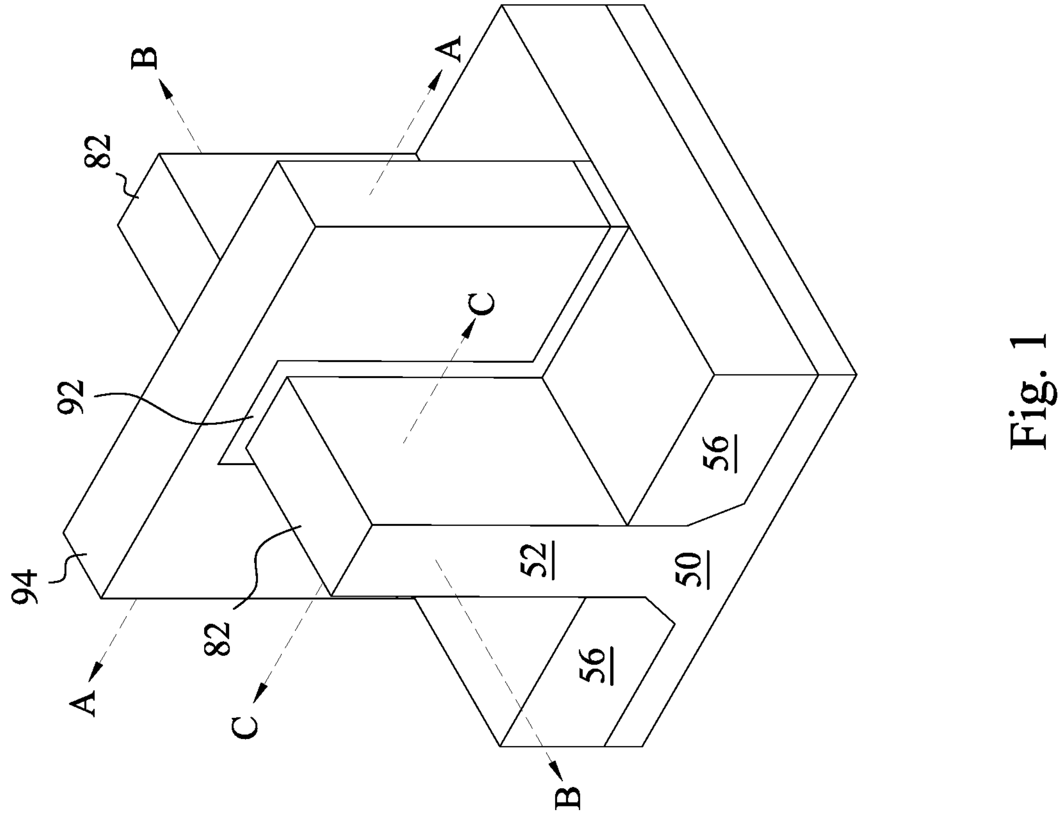
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a FinFET in a three-dimensional view, in accordance with some embodiments. The FinFET comprises a fin 52 on a substrate 50 (e.g., semiconductor substrate, wafer, or the like). Isolation regions 56 are disposed in the substrate 50, and the fin 52 protrudes above and from between neighboring isolation regions 56. Although the isolation regions 56 are described and illustrated as separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 6 are cross-sectional views of intermediate stages in the manufacturing of FinFETs, in accordance with some embodiments. FIGS. 2 through 6 are illustrated with reference to cross-section A-A illustrated in FIG. 1, except for multiple fins/FinFETs.

Figure 2:
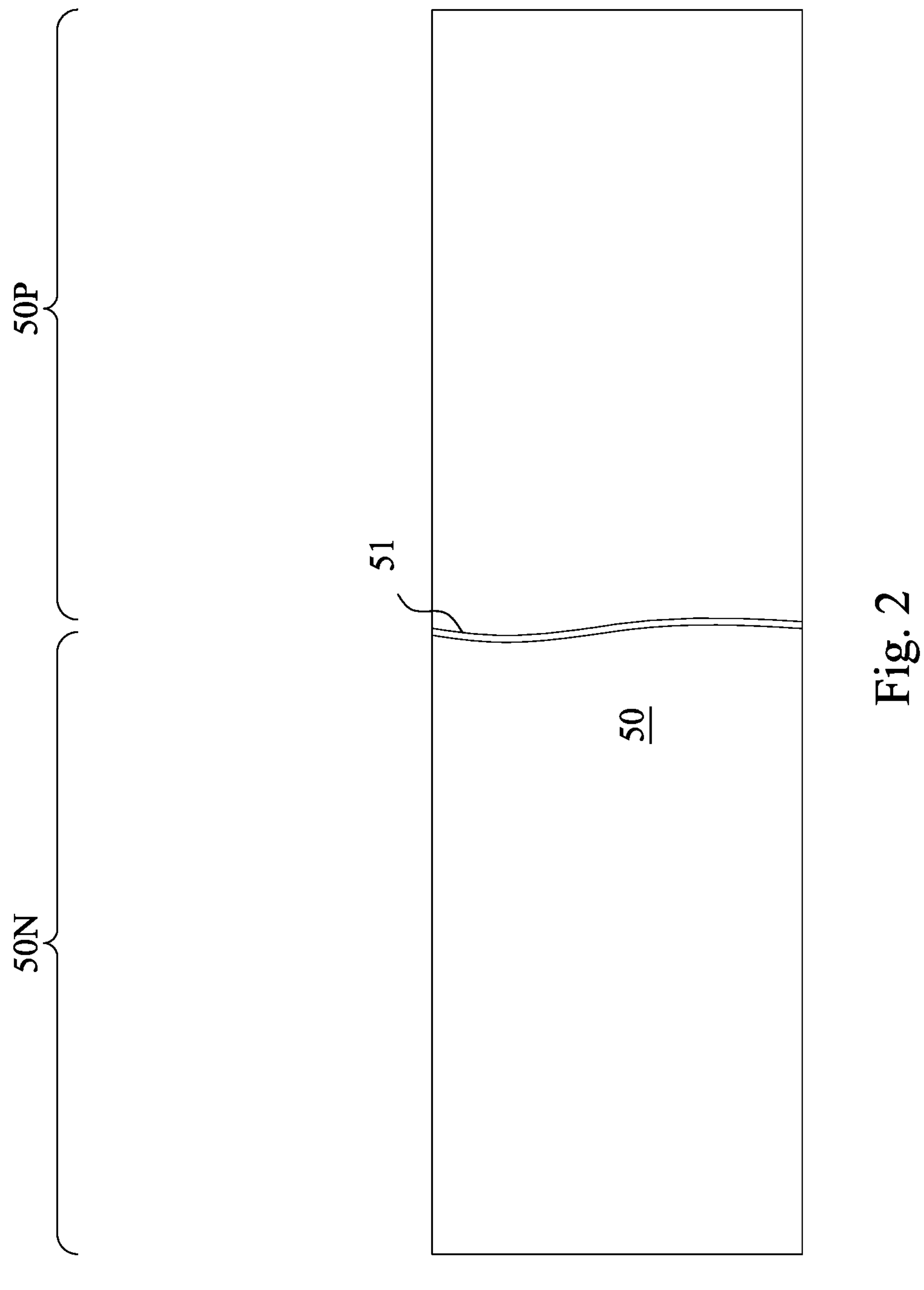

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically silicon or glass substrate.

Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
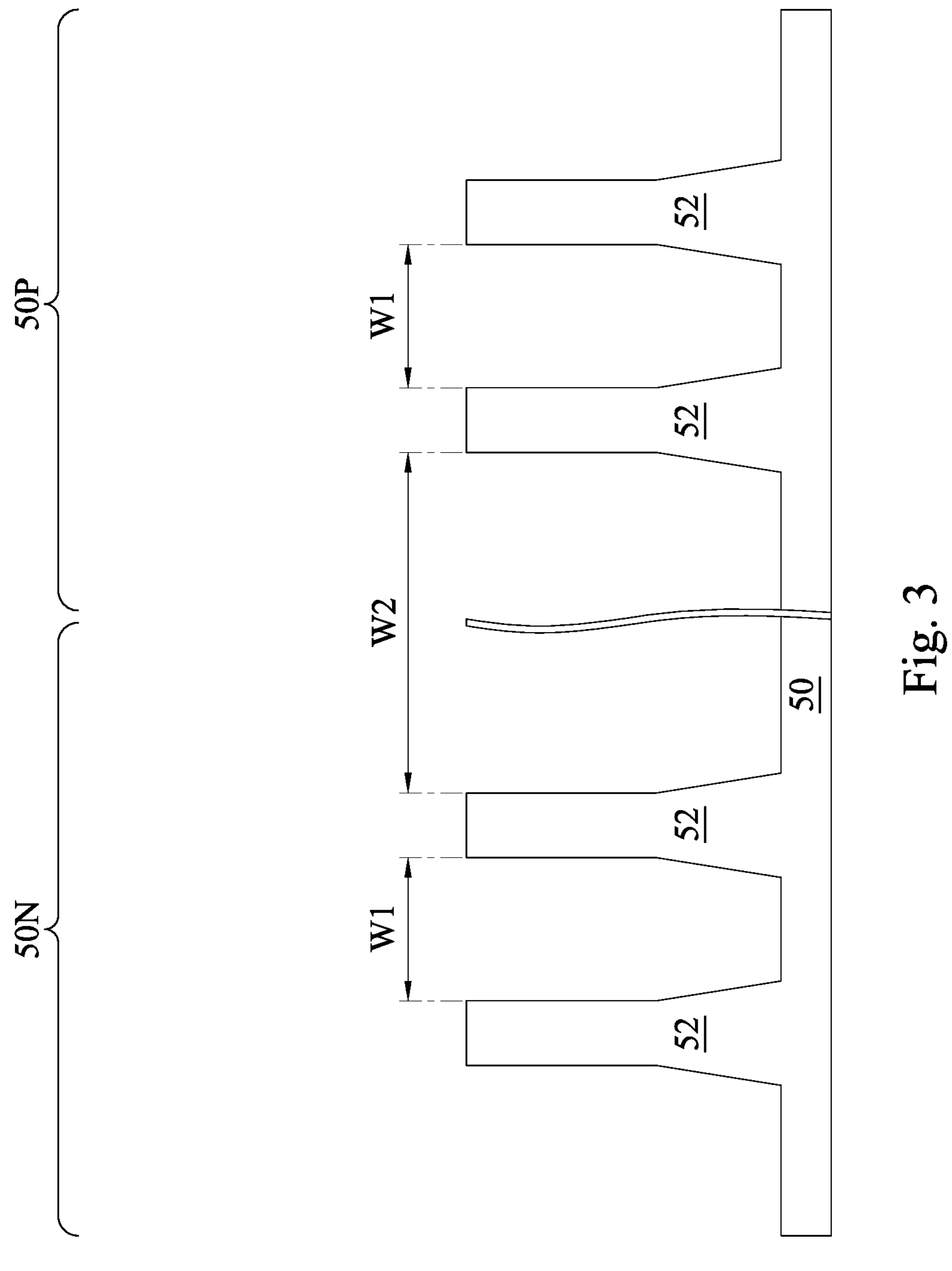

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

The fins 52 may be patterned with vertical sidewalls, angled sidewalls, combinations, or the like. Furthermore, the fins 52 in the n-type region 50N and in the p-type region 50P may be formed to a first width $W_1$, although the fins 52 formed in the p-type region 50P may have a different separation from the fins 52 formed in the n-type region 50N. According to some embodiments, the first width $W_1$ is between about nm and about 30 nm. Furthermore, a space between fins 52 of the n-type region 50N and the fins 52 of the p-type region 50P may be a second width W2 that is between about 5 nm and about 100 nm. However, any suitable distance may be used.

Figure 4:
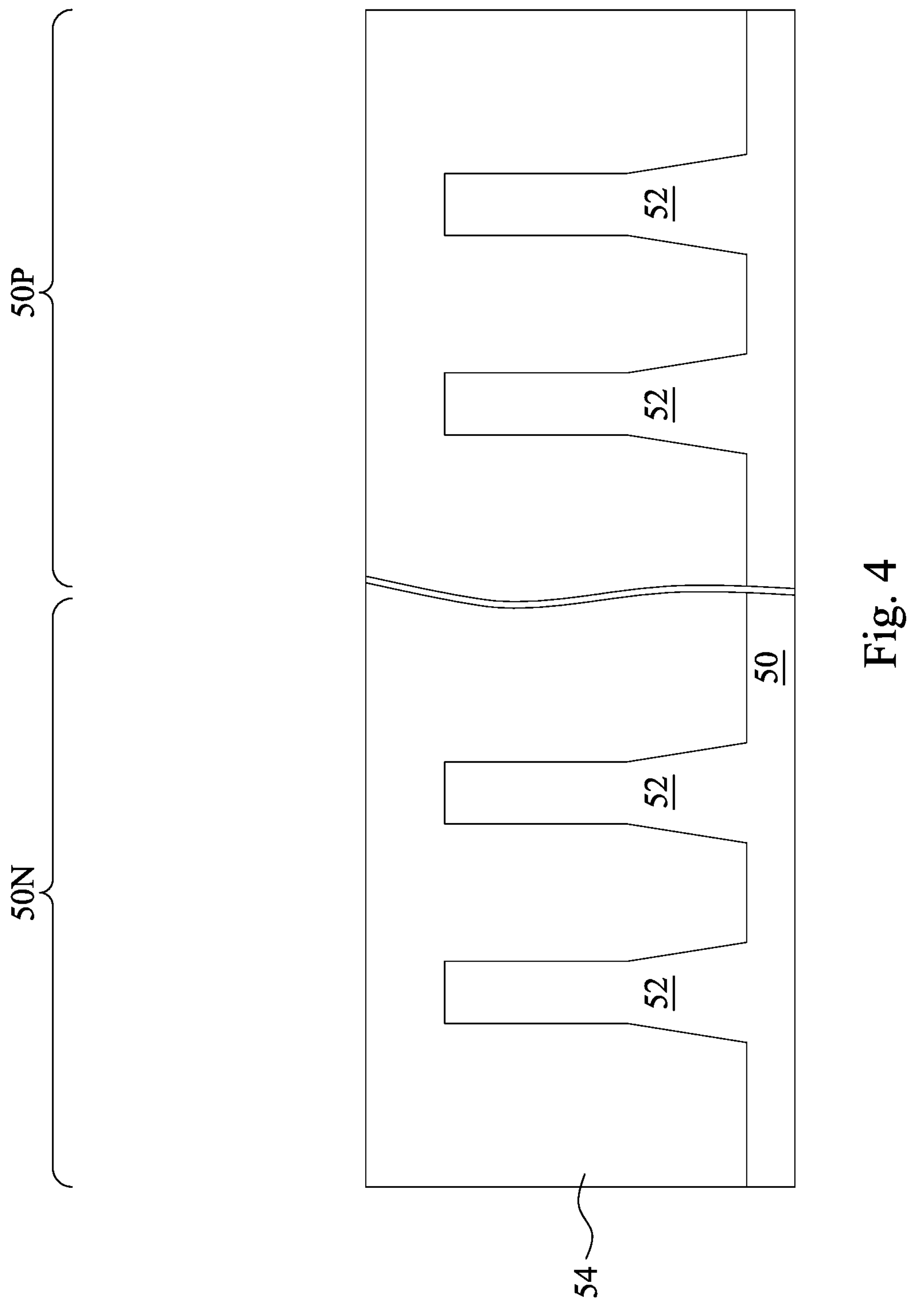

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess material of the insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
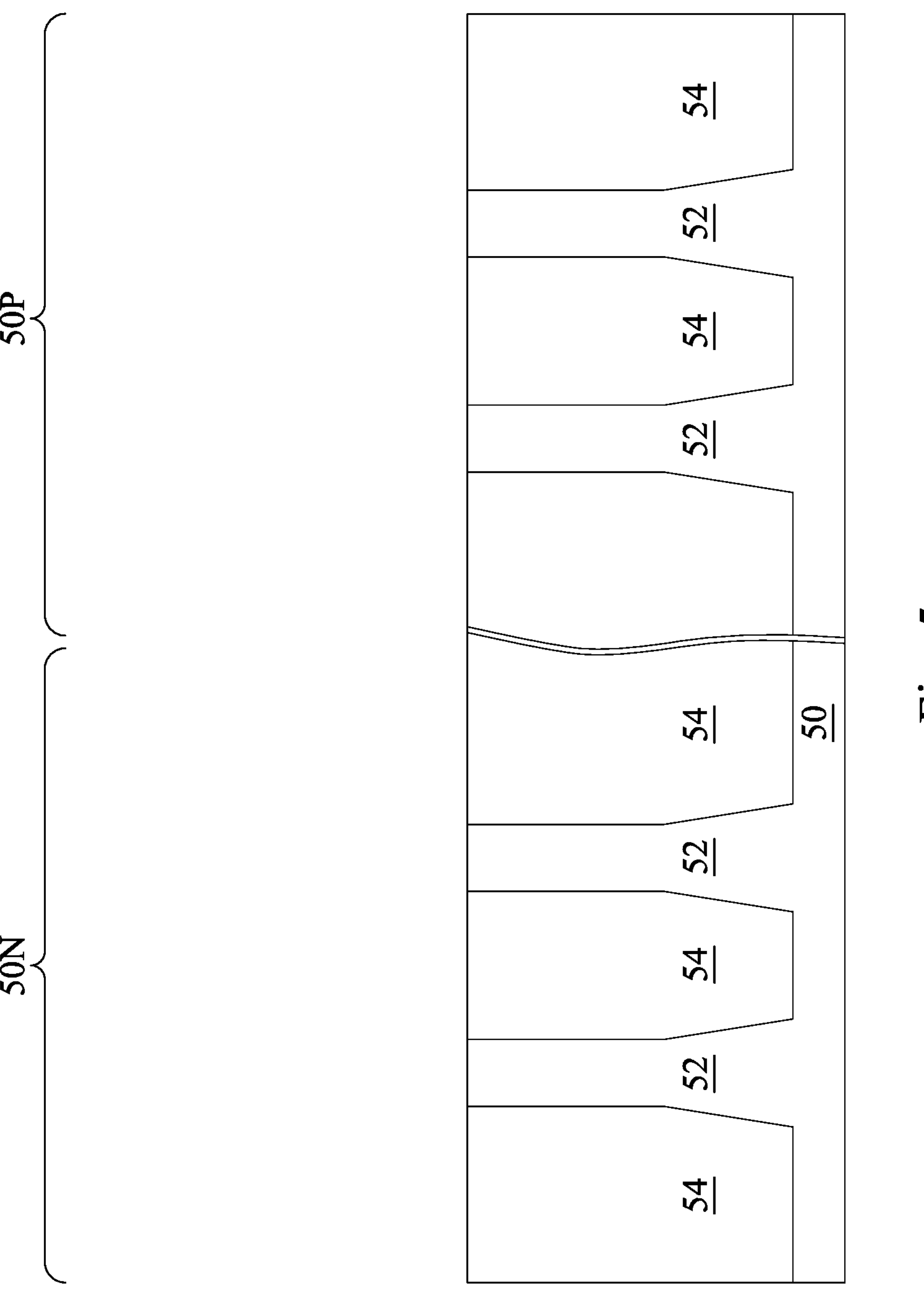

In FIG. 5, a removal process is applied to the insulation material 54 to remove excess material of the insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete.

Figure 6:
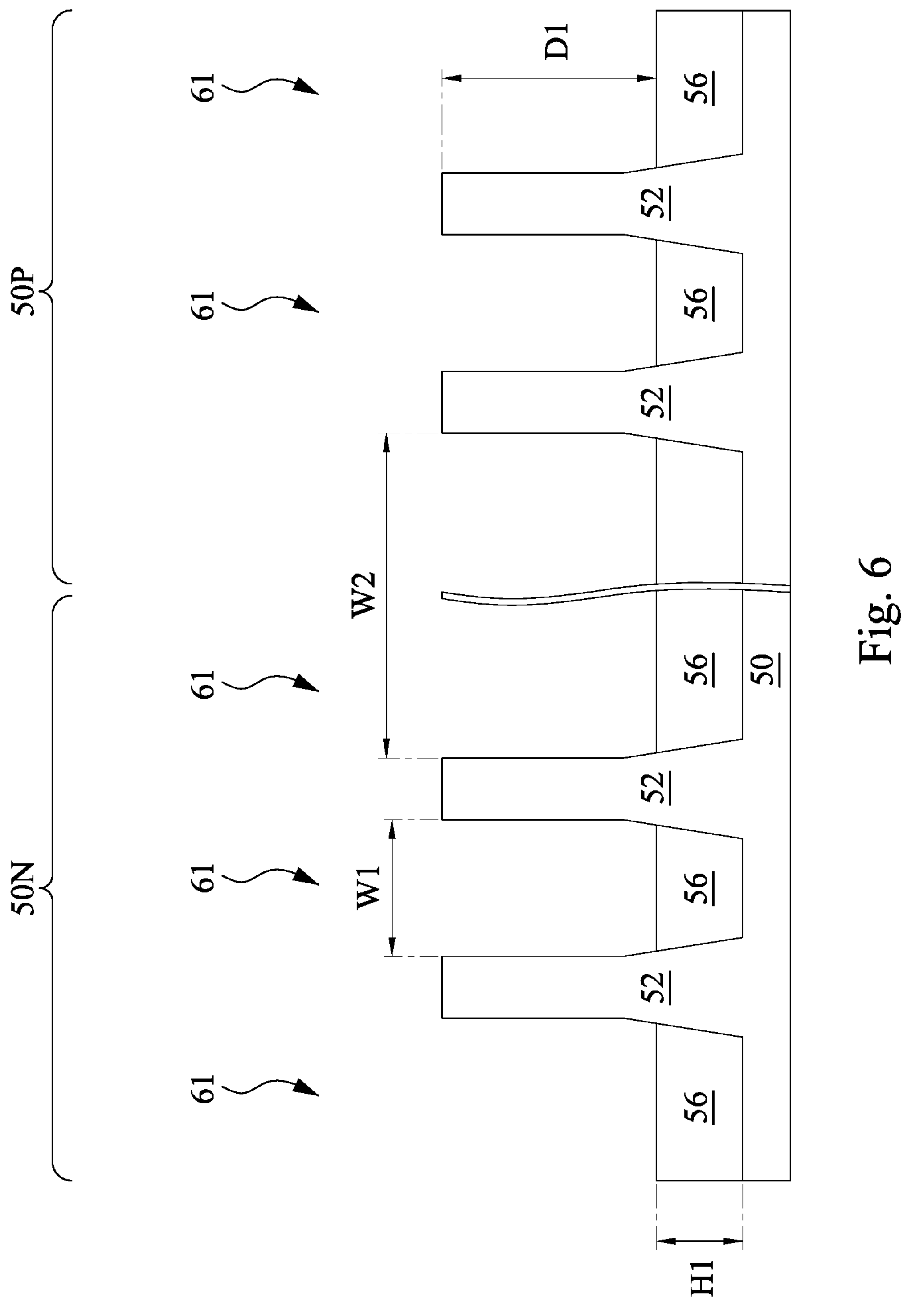

In FIG. 6, the insulation material 54 is recessed to form isolation regions 56 (e.g., Shallow Trench Isolation (STI) regions). The insulation material 54 is recessed such that upper portions of fins 52 in the n-type region 50N and in the p-type region protrude from between neighboring ones of the isolation regions 56. According to some embodiments, the isolation regions 56 may be recessed to a first depth Di of between about 25 nm and about 100 nm such that the isolation regions 56 have a first height H1 of between about 5 nm and about 100 nm. However, any suitable height may be used for the isolation regions 56. As such, the portions of the trenches 61 above the isolation regions 56 may have an aspect ratio of the first depth Di to the first width W1 or the third width W3 in a range between about 3:1 and about 9:1.

Furthermore, the top surfaces of the isolation regions 56 may have a flat surface as illustrated, a convex surface, a concave surface (such as dishing), or a combination thereof. The top surfaces of the isolation regions 56 may be formed flat, convex, and/or concave by an appropriate etch. The isolation regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some other embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist or other masks (not shown). For example, a photoresist may be formed over the fins 52 and the isolation regions 56 in the n-type region 50N. The photoresist is patterned to expose the p-type region 50P of the substrate 50, such as a PMOS region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the p-type region 50P, a photoresist is formed over the fins 52 and the isolation regions 56 in the p-type region 50P. The photoresist is patterned to expose the n-type region 50N of the substrate 50, such as the NMOS region. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the n-type region 50N and the p-type region 50P, an anneal process may be performed to activate the p-type and/or n-type impurities that were implanted. In some embodiments, the grown materials of epitaxial fins may be in situ doped during growth, which may obviate the implantations, although in situ and implantation doping may be used together.

Figure 7A:
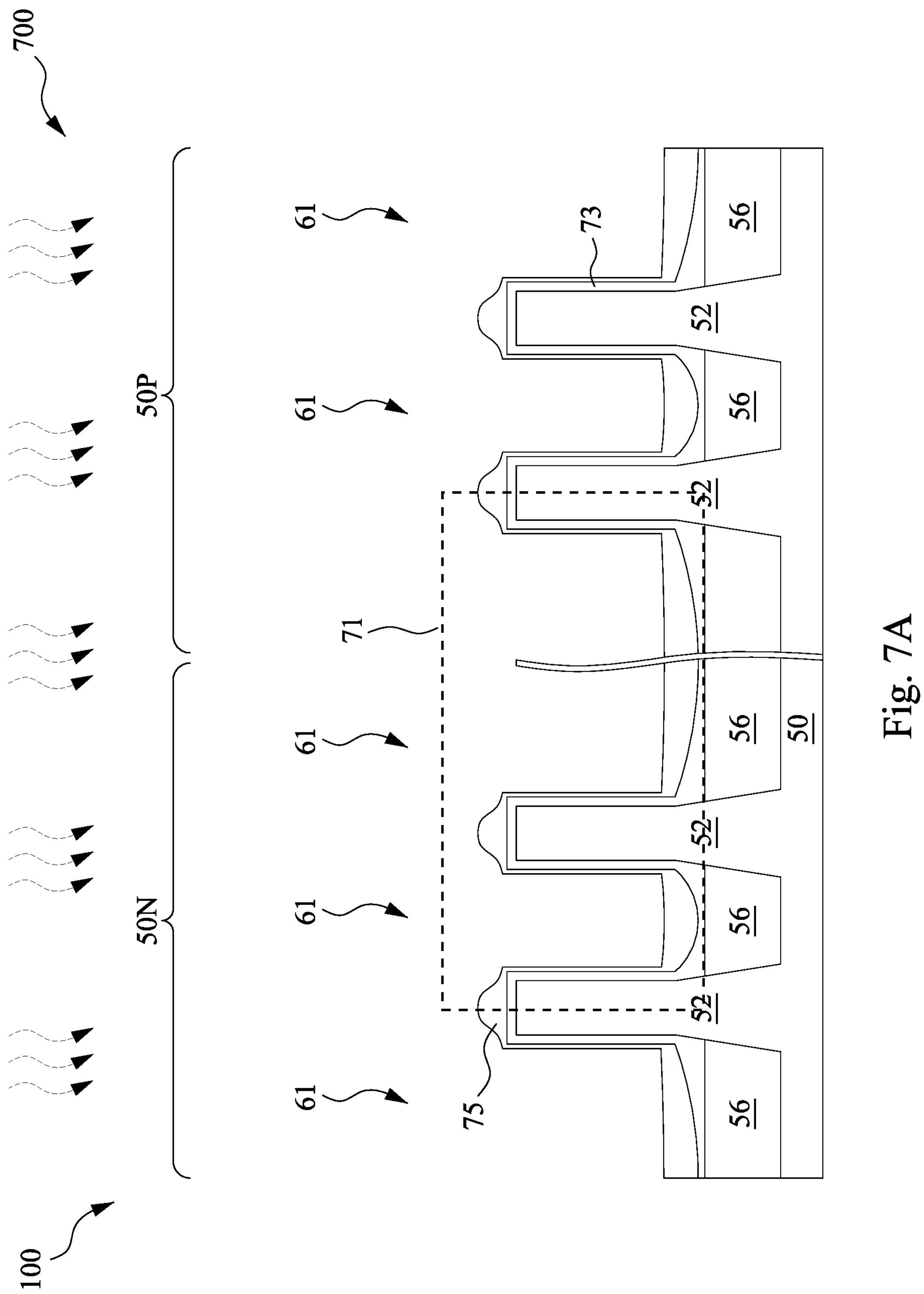
Figure 10A:
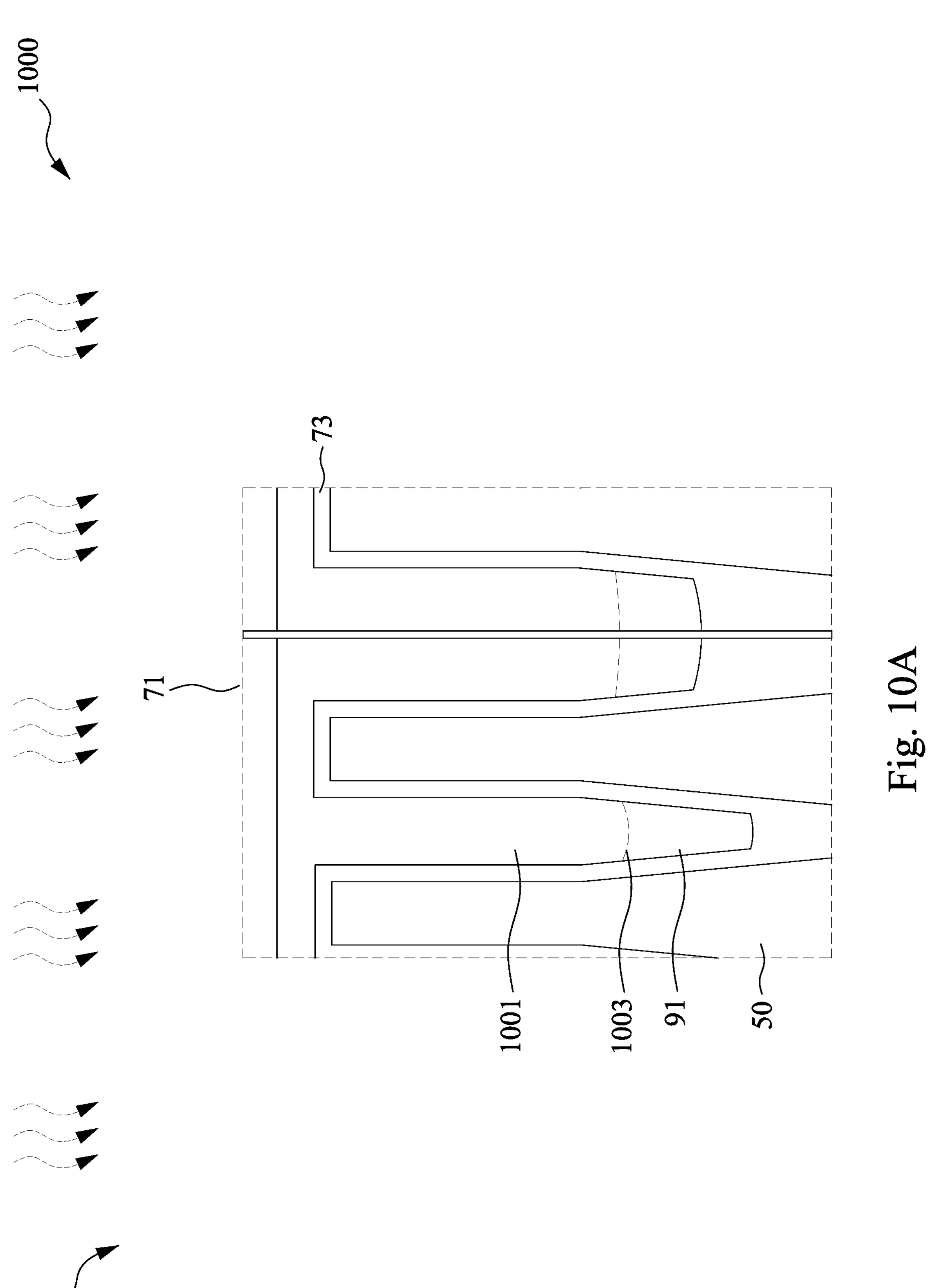
Figure 10B:
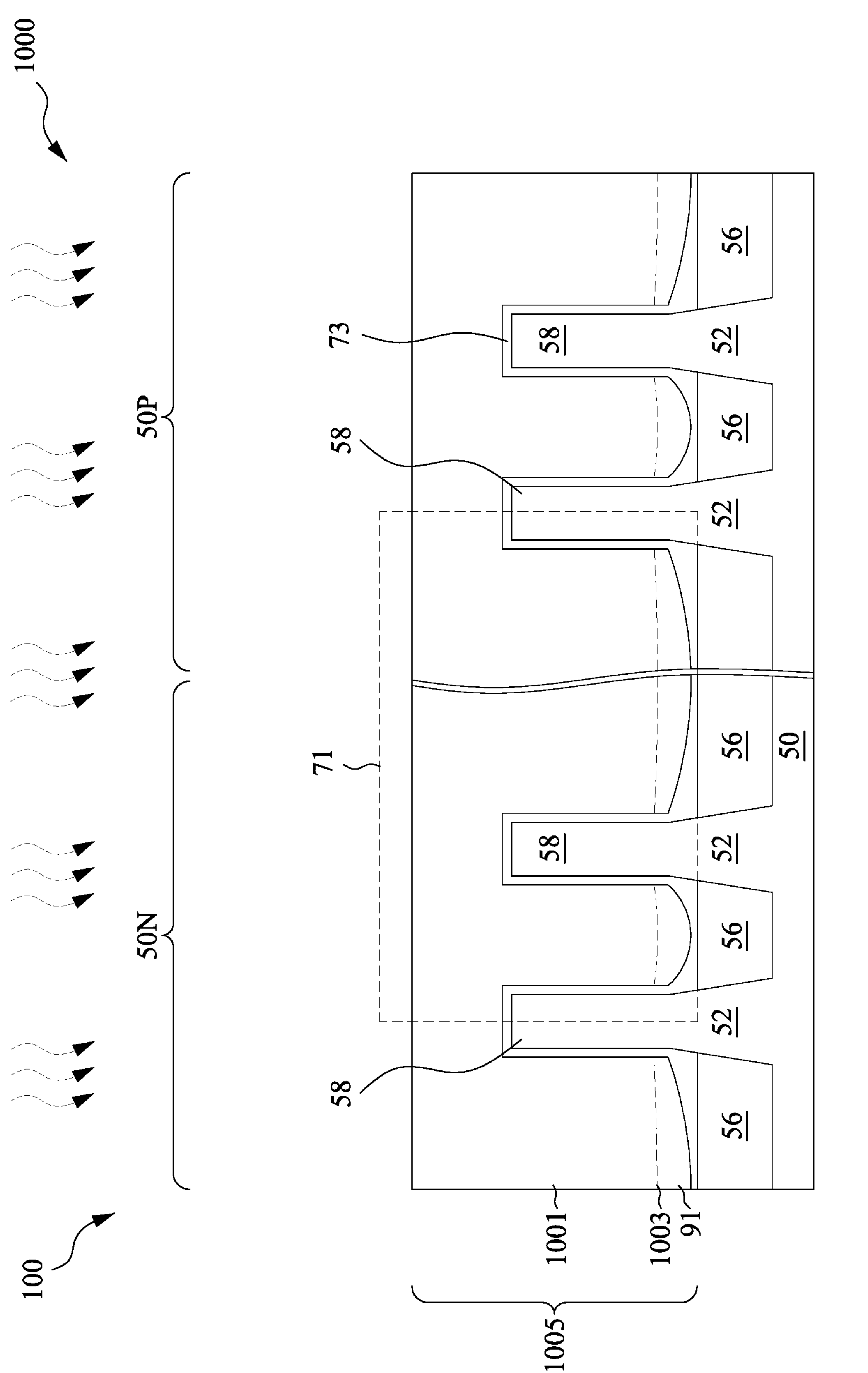

FIGS. 7A through 10B illustrate cross-sectional views of a workpiece 100 at intermediate stages of a gap-filling process, according to some embodiments. Furthermore, FIG. 7A illustrates a first section 71 of the workpiece 100 that is highlighted with a dashed line. FIGS. 7B-10A illustrate steps in the gap-filling process in magnified views of the first section 71. FIG. 10B illustrates the intermediate stage shown in FIG. 10A in a non-magnified view of the workpiece 100.

Figure 7B:
Figure 7B:
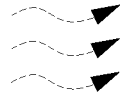
Figure 7B:
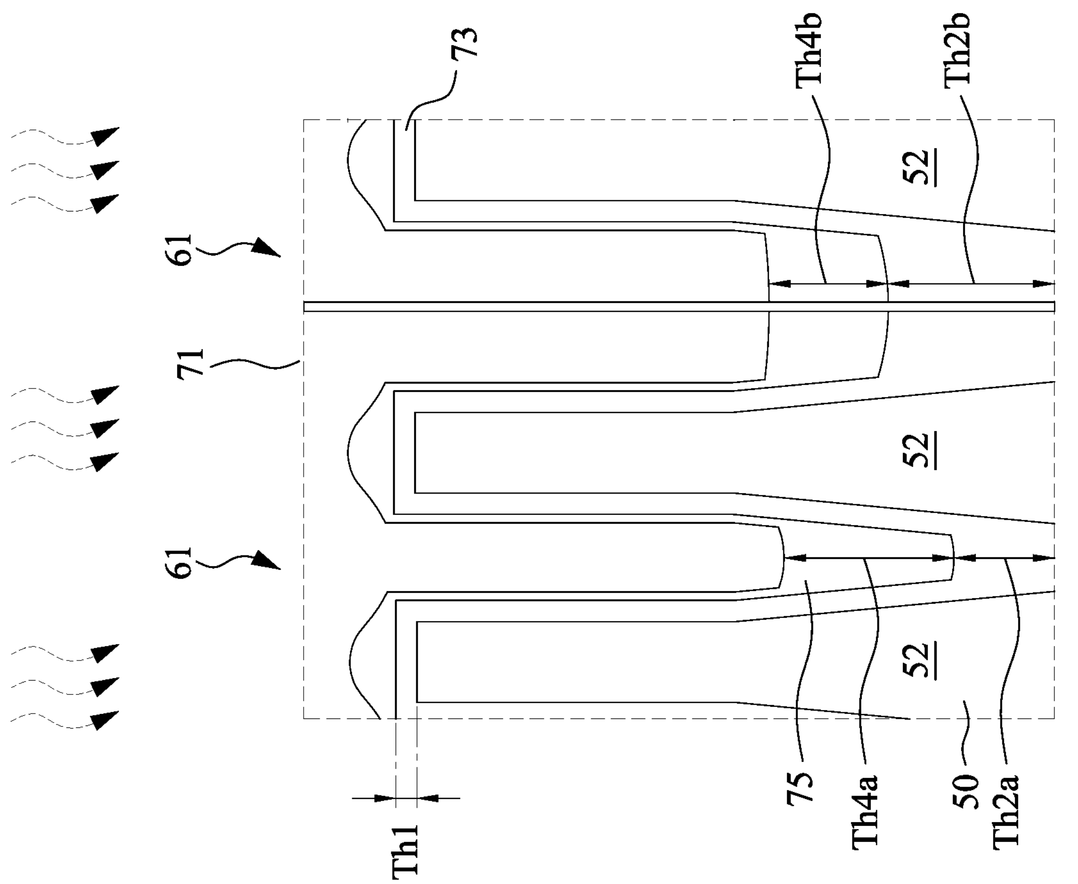
Figure 7B:
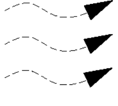
Figure 7B:
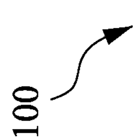

In particular, FIGS. 7A and 7B illustrate a formation of a dummy gate dielectric layer 73 over the fins 52 and a seed layer deposition process 700 using a flowable film to form a bottom layer 75 over the dummy gate dielectric layer 73, in accordance with some embodiments. The dummy gate dielectric layer 73 may be, for example, a dielectric such as silicon oxide (e.g., $SiO_2$), silicon nitride (SiN), silicon oxynitride (SiON), a combination thereof, or the like, and may be deposited or thermally grown according to acceptable techniques such as plasma-enhanced atomic layer deposition (PEALD), plasma enhanced chemical vapor deposition (PECVD), vapor phase epitaxy (VPE), molecular beam epitaxy (MBE), combinations, or the like. According to some embodiments, the dummy gate dielectric layer 73 may be formed to a first thickness Th1 (see FIG. 7B) of between about 1 nm and about 10 nm over and along sidewalls of the fins 52. However, any suitable thicknesses may be used for the first thickness Th1.

According to some embodiments, the dummy gate dielectric layer 73 may also be formed over the isolation regions 56 at the bottoms of the trenches 61 to a second thickness Th2 of between about 5 nm and about 100 nm. However, any suitable thickness may be used. In some embodiments, the second thickness Th2 of the dummy gate dielectric layer 73 at the bottoms of the trenches 61 may depend on the shapes of the fins 52 and the widths of the trench between the fins 52. As such, the dummy gate dielectric layer 73 may have one thickness (e.g., Th2*a*) at the bottom of one of the trenches 61, such as between about 5 nm and about 100 nm, and may have a different thickness (e.g., Th2*b*) at the bottom of another one of the trenches 61, such as between about 5 nm and about 100 nm.

Once the dummy gate dielectric layer 73 has been formed, the seed layer deposition process 700 is performed to deposit the bottom layer 75. In some embodiments the bottom layer 75 may be a conductive material or a non-conductive material such as a flowable silicon (Si) film that can "flow" during or after deposition to fill voids in a gap. However, any suitable material may be utilized.

Figure 7C:
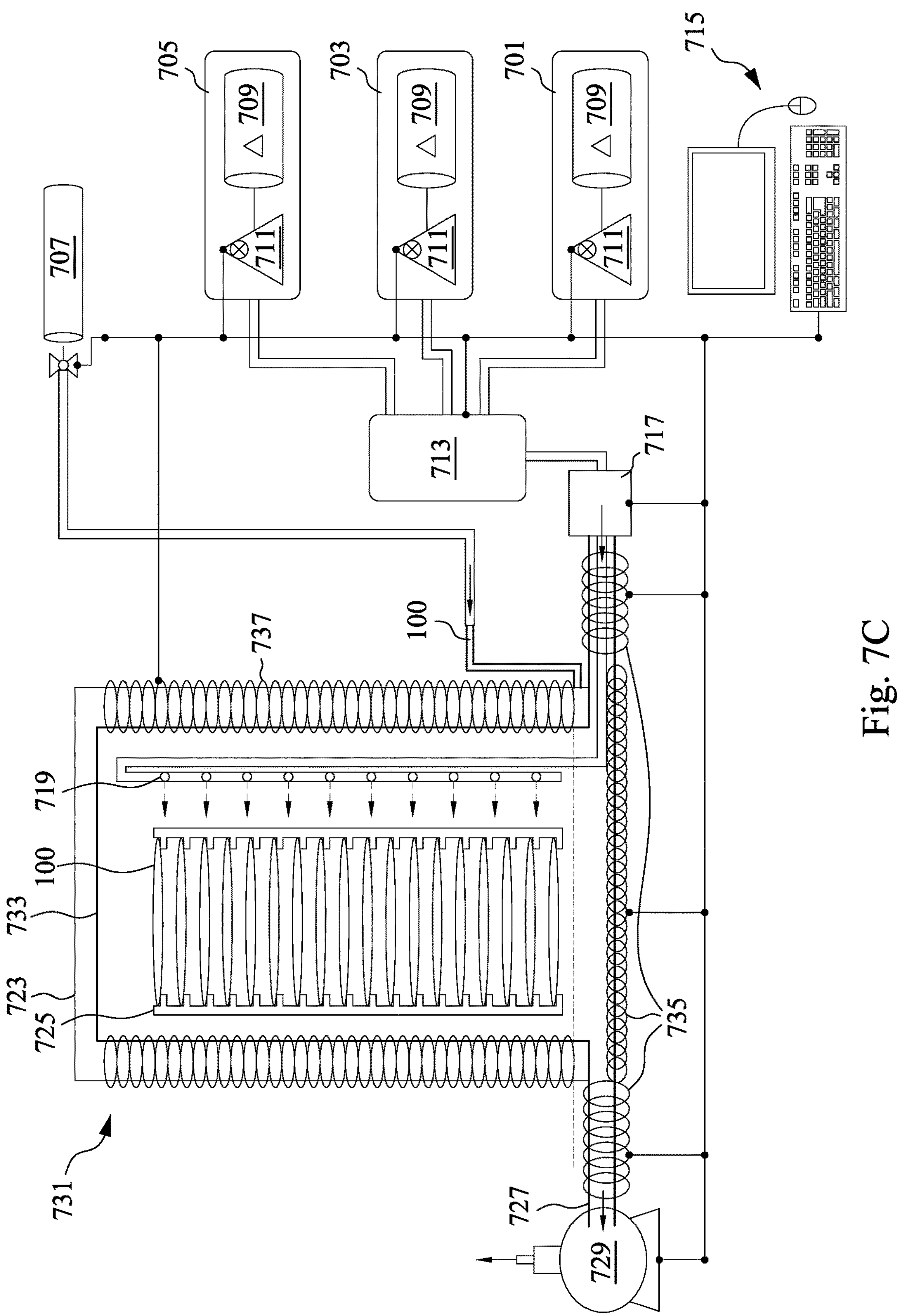

FIG. 7C illustrates a deposition system 731 which may be utilized in order to deposit material of the bottom layer 75. The deposition system 731 may be utilized to receive precursor materials for the flowable deposition process from a plurality of precursor delivery systems, such as a first precursor delivery system 701, a second precursor delivery system 703, and a third precursor delivery system 705 and form layers of materials onto the substrates 100 within a deposition chamber 733.

In an embodiment the first precursor delivery system 701, the second precursor delivery system 703, and the third precursor delivery system 705 may work in conjunction with one another to supply the one or more different precursor materials to a deposition chamber 733 wherein one or more of the substrates 100 are placed. However, the first precursor delivery system 701, the second precursor delivery system 703, and the third precursor delivery system 705 may have physical components that are similar with each other. For example, the first precursor delivery system 701, the second precursor delivery system 703, and the third precursor delivery system 705 may each include a gas supply 709 and a flow controller 711. In an embodiment in which the first precursor is stored in a gaseous state, the gas supply 709 may supply the first precursor to the deposition chamber 733. The gas supply 709 may be a vessel, such as a gas storage tank, that is located either locally to the deposition chamber 733 or else may be located remotely from the deposition chamber 733. Alternatively, the gas supply 709 may be a facility that independently prepares and delivers the first precursor to the flow controller 711. Any suitable source for the first precursor may be utilized as the gas supply 709, and all such sources are fully intended to be included within the scope of the embodiments.

The gas supply 709 may supply the desired precursor to the flow controller 711. The flow controller 711 may be utilized to control the flow of the precursor to a precursor gas controller 713 and, eventually, to the deposition chamber 733, thereby also helping to control the pressure within the deposition chamber 733. The flow controller 711 may be, e.g., a proportional valve, a modulating valve, a needle valve, a pressure regulator, a mass flow controller, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas supply 709 may store a carrier gas and the carrier gas may be introduced into a precursor canister, which stores the first precursor in the solid or liquid state. The carrier gas is then used to push and carry the first precursor as it either evaporates or sublimates into a gaseous section of the precursor canister before being sent to the precursor gas controller 713. Any suitable method and combination of units may be utilized to provide the first precursor, and all such combination of units is fully intended to be included within the scope of the embodiments.

The first precursor delivery system 701, the second precursor delivery system 703, and the third precursor delivery system 705 may supply their individual precursor materials into a precursor gas controller 713. The precursor gas controller 713 connects and isolates the first precursor delivery system 701, the second precursor delivery system 703, and the third precursor delivery system 705 from the deposition chamber 733 in order to deliver the desired precursor materials to the deposition chamber 733. The precursor gas controller 713 may include such devices as valves, flow meters, sensors, and the like to control the delivery rates of each of the precursors and may be controlled by instructions received from a control unit 715.

The precursor gas controller 713, upon receiving instructions from the control unit 715, may open and close valves so as to connect one or more of the first precursor delivery system 701, the second precursor delivery system 703, and the third precursor delivery system 705 to the deposition chamber 733 and direct a desired precursor material through a manifold 717, into the deposition chamber 733, and to an injection unit 719. The injection unit 719 may be utilized to disperse the chosen precursor material(s) into the deposition chamber 733 and may be designed to evenly disperse the precursor material in order to minimize undesired process conditions that may arise from uneven dispersal. In a particular embodiment the injection unit 719 may be formed, for example, from coiled tubing including a plurality of holes distributed throughout the tubing allowing for uniform dispersal of the precursor material in the deposition chamber 733. However, any suitable shape may be utilized.

However, as one of ordinary skill in the art will recognize, the introduction of precursor materials to the deposition chamber 733 through a single unit as described above is intended to be illustrative only and is not intended to be limiting to the embodiments. Any number of separate and independent injectors or other openings to introduce precursor materials into the deposition chamber 733 may alternatively be utilized. All such combinations and other points of introduction are fully intended to be included within the scope of the embodiments.

The deposition chamber 733 may receive the desired precursor materials and expose the precursor materials to the substrates 100, and the deposition chamber 733 may be any desired shape that may be suitable for dispersing the precursor materials and contacting the precursor materials with the substrates 100. In the embodiment illustrated in FIG. 7C, the deposition chamber 733 has a cylindrical sidewall and a bottom. However, the deposition chamber 733 is not limited to a cylindrical shape, and any other suitable shape, such as a hollow square tube, an octagonal shape, or the like, may be utilized. Furthermore, the deposition chamber 733 may be surrounded by a housing 723 made of material that is inert to the various process materials. As such, while the housing 723 may be any suitable material that can withstand the chemistries and pressures involved in the deposition process, in an embodiment the housing 723 may be steel, stainless steel, nickel, aluminum, alloys of these, combinations of these, and like.

Within the deposition chamber 733 a plurality of the substrates 100 may be placed within a rack on a mounting rack 725 in order to position and control the substrates 100 during the deposition processes. The mounting rack 725 may include heating mechanisms in order to heat the substrates 100 during the deposition processes. Furthermore, while a mounting rack 725 is illustrated in FIG. 7C, a single mounting platform for supporting a single wafer may be included within the deposition chamber 733.

In addition, the deposition chamber 733 may include heating elements 735 and/or heating lamps configured to control the temperatures of precursor gases (e.g., the first precursor) entering the deposition chamber 733 and the exhaust gases exiting the deposition chamber 733. According to embodiments, as the precursors enter the manifold 717 the heating elements 735 either maintain or else raise the temperature of the precursors to a process temperature above a boiling point of the precursors to ensure that the precursor remains in a gas-phase and maintain a suitable flow rate of the precursors at the injection unit 719. Furthermore, as the exhaust gases are evacuated from the deposition chamber 733, the heating elements 735 maintain or raise the temperature of the exhaust gases at the exhaust outlet 727 to a temperature above a boiling point of the exhaust gases to maintain a suitable evacuation rate of the exhaust at the vacuum pump 729.

The deposition chamber 733 further comprises cooling elements 737 and a coolant source 707, according to some embodiments. The cooling elements 737 are located within the housing 723 adjacent the injection unit 719 and the rack 725. The control unit 715 controls the valve at the coolant source 707 to release coolant into the cooling elements 737. As such, the temperatures of the precursor gases are controlled to a desired process temperature as they exit the injection unit 719 and at the locations of the substrates 100 during the deposition process. According to some embodiments, the process temperature of the precursor gases released at the injection unit 719 and at the substrates 100 is controlled to a temperature below the boiling point of the precursors to transition the precursor gases released from the injection unit 719 to the liquid phase of the precursor (e.g., condensation of the precursor). As such, a flowable deposition of the precursor material is deposited onto the substrates 100.

A vacuum pump 729 may be connected to an exhaust outlet 727 of the deposition chamber 733 in order to help evacuate the exhaust gases. The exhaust outlet 727, under control of the control unit 715, may also be utilized to reduce and control the pressure within the deposition chamber 733 to a desired pressure and may also be utilized to evacuate precursor materials from the deposition chamber 733 in preparation for the introduction of the next precursor material.

The control unit 715 may be utilized to control the precursor gas controller 713, the vacuum pump 729, the heating elements 735, the coolant source 707, and/or the cooling elements 737. The control unit 715 may be any form of computer processor that can be used in an industrial setting for controlling process machines. In an embodiment the control unit 715 may comprise a processing unit, such as a desktop computer, a workstation, a laptop computer, or a dedicated unit customized for a particular application. The control unit 715 may be equipped with a display and one or more input/output components, such as instruction outputs, sensor inputs, a mouse, a keyboard, printer, combinations of these, or the like. The processing unit may include a central processing unit (CPU), memory, a mass storage device, a video adapter, an I/O interface, and/or a network interface connected to a bus.

The bus may be one or more of any type of several bus architectures including a memory bus or memory controller, a peripheral bus, or video bus. The CPU may comprise any type of electronic data processor, and the memory may comprise any type of system memory, such as static random access memory (SRAM), dynamic random access memory (DRAM), or read-only memory (ROM). The mass storage device may comprise any type of storage device configured to store data, programs, and other information and to make the data, programs, and other information accessible via the bus. The mass storage device may comprise, for example, one or more of a hard disk drive, a magnetic disk drive, or an optical disk drive.

The video adapter and the I/O interface provide interfaces to couple external input and output devices to the processing unit. Examples of input and output devices include, but are not limited to, the display coupled to the video adapter and the I/O component, such as a mouse, keyboard, printer, and the like, coupled to the I/O interface. Other devices may be coupled to the processing unit and additional or fewer interface cards may be utilized. For example, a serial interface card (not shown) may be used to provide a serial interface for a printer.

The network interface couples the processing unit to external networks to facilitate network communications and to provide network access to external resources via one or more wired and/or wireless links (e.g., local area network (LAN) and/or wide area network (WAN)). The network access and network communications may use one or more circuit switched networks and/or packet switched networks. In an embodiment the control unit 715 may be a system that is locally connected via one or more wired and/or wireless connections to the precursor gas controller 713, the vacuum pump 729, the coolant source 707, the cooling elements 737, and the heating elements 735. In another embodiment the control unit 715 may be a system that is remote from the precursor gas controller 713, the vacuum pump 729, the coolant source 707, the cooling elements 737, and/or the heating elements 735 and may connect and control the precursor gas controller 713 and vacuum pump 729 via a remote wired and/or wireless connection. In an embodiment, the control unit 715 may be a distributed system comprising one or more processing units of one or more network servers and/or may employ one or more network services for controlling the precursor gas controller 713, the vacuum pump 729, the coolant source 707, the cooling elements 737, and/or the heating elements 735.

It should be noted that the control unit 715 may include other components. For example, the control unit 715 may include power supplies, cables, a motherboard, removable storage media, cases, and the like. These other components, although not shown in FIG. 7C, are considered part of the control unit 715.

To begin the deposition process, a first precursor for the bottom layer 75 may be placed into one or more of the first precursor delivery system 701, the second precursor delivery system 703, and/or the third precursor delivery system 705. In an embodiment in which the bottom layer 75 is desired to be silicon, the first precursor may be a higher order silane ($Si_nH_{2n+2}$ for n>3) such as tetrasilane ($Si_4H_{10}$) (including n-$Si_4H_{10}$ and iso-$S_4H_{10}$), pentasilane ($Si_5H_{12}$) (including n-$Si_5H_{12}$, iso-$Si_5H_{12}$, and neo-$Si_5H_{12}$), cyclopentasilane ($Si_5H_{10}$), hexasilane ($Si_6H_{14}$) (including n-$Si_6H_{14}$ and iso-$Si_6H_{14}$), cyclo-$Si_6H_{12}$, heptasilane ($Si_7H_{16}$) (including n-$Si_7H_{16}$), combinations, or the like. However, any suitable precursor for any suitable material may be utilized.

During the deposition process, the first precursor is introduced into the deposition chamber 733 as a vapor (maintained by, e.g., the heating elements 735). However, as the first precursor flows over the substrates 100, the cooling elements 737 remove heat and cause the first precursor to cool down below a transition temperature, causing the first precursor to condense onto the exposed surface of the substrates 100. Further, condensing as a liquid causes the first precursor to further flow into and fill the trenches 61 without voids. Additionally, once in place on the surface, the first precursor (e.g., higher order silane) will react with the dummy gate dielectric layer 73 (e.g., $SiO_2$) to form the material of the bottom layer 75 that is desired to be deposited (e.g., silicon) without forming any voids and without forming any seams.

The seed layer deposition process 700 may be controlled by adjusting process conditions (e.g., temperature, pressure, flow rates, combinations or the like) during deposition to form the flowable film in the trenches 61. As such, the bottom layer 75 is formed as a non-conformal layer over the dummy gate dielectric layer 73 and along sidewalls of the dummy gate dielectric layer 73 in the trenches 61. According to some embodiments, the bottom layer 75 may be formed over the dummy gate dielectric layer 73 at the bottoms of the trenches 61 to a fourth thickness Th4 of between about 0.5 nm and about 50 nm. However, any suitable thickness may be used. In some embodiments, as illustrated in FIGS. 7A and 7B, the fourth thickness Th4 of the bottom layer 75 may depend on the shapes of the fins 52 and the widths of the trench 61 between the fins 52. As such, the bottom layer 75 may have one thickness (e.g., Th4*a*) at the bottom of one of the trenches 61, such as between about 0.5 nm and about nm, and may have a different thickness (e.g., Th4*b*) at the bottom of another one of the trenches 61, such as between about 0.5 nm and about 50 nm. However, any suitable thicknesses may be utilized.

FIG. 8 illustrates a formation of bottom seed structures 77, in accordance with some embodiments. Once the bottom layer 75 has been deposited, a seed layer etch process 800 may be performed to remove excess materials of the bottom layer 75. As such, the excess material of the bottom layer 75 is removed from outside of the trenches 61 and along the sidewalls of the trenches 61 above a desired level of the bottom layer 75. The seed layer etch process 800 may be used to reduce a height of the bottom layer 75 and to shape the bottom layer 75 to form the bottom seed structures 77 at the bottoms of the trenches 61.

The seed layer etch process 800 may be performed using precursors such as hydrogen chloride (HCl), chlorine ($Cl_2$), combinations or the like and carrier gases such as hydrogen ($H_2$), nitrogen ($N_2$), combinations, or the like. According to some embodiments, the seed layer etch process 800 is performed using a carrier gas flow rate of between about 0 slm and about 20 slm. In embodiments in which hydrogen chloride (HCl) is used as a precursor, a process temperature of between about 500° C. and about 650° C. is used. For embodiments in which chlorine ($Cl_2$) is used as a precursor, a process temperature of between about 300° C. and about 450° C. is used. Furthermore, the seed layer etch process can be performed using a process pressure of between about 0.1 Torr and about 200 Torr. However, any suitable parameters may be utilized.

In some embodiments, the seed layer etch process 800 may be performed in situ within the deposition chamber 733. In such an embodiment the precursors (e.g., HCl) may be placed into one or more of the first precursor delivery system 701, the second precursor delivery system 703, and/or the third precursor delivery system 705. However, in other embodiments the seed layer etch process 800 may be performed in a separate chamber.

According to some embodiments, the bottom seed structures 77 after etching are formed to a second height H2*a* within one of the openings 81 of between about 0.5 nm and about 50 nm and a second height H2*b* within another one of the openings 81 of between about 0.5 nm and about 50 nm. Furthermore, the bottom layer 75 may be shaped to a desired profile (e.g., concave, convex, facet-limited, flat, or the like) for the bottom seed structures 77. In some embodiments, the bottom seed structures 77 are shaped to a first profile having a concave shape. However, any suitable height and/or any suitable profile may be utilized for the bottom seed structures 77. Once the bottom seed structures 77 have been formed, the spaces remaining with the trenches 61 define openings 81.

Once the bottom seed structures 77 have been formed, a seed layer treatment 900 may be performed to remove impurities (e.g., hydrogen (H)) from the material of the bottom seed structures 77. As shown in FIG. 9, according to some embodiments, the seed layer treatment 900 is performed in a chamber containing an ambient such as nitrogen ($N_2$), hydrogen ($H_2$), combinations of these, or the like. The seed layer treatment 900 may be performed using the ambient in a furnace annealing procedure or a rapid thermal annealing technique. The seed layer treatment 900 is performed using a process temperature of between about 400° C. and about 1000° C., in accordance with some embodiments. However, any suitable temperature may be used. The seed layer treatment 900 is performed using a process pressure of between about 0.01 Torr and about 760 Torr. However, any suitable process pressure may be utilized. In some embodiments, the seed layer treatment 900 is performed for a process time of between about 1 msec and about 10 hours. As such, a concentration of the impurities in the bottom seed structures 77 is reduced to a concentration of between about 0% by volume and about 2% by volume. However, any suitable concentration may be utilized. As such, treated bottom seed structures 91 are formed from the bottom seed structures 77.

FIGS. 10A and 10B illustrate a bottom-up deposition process 1000 to form a dummy gate material layer 1001 over the treated bottom seed structures 91 and over the dummy gate dielectric layer 73, according to some embodiments. In an embodiment in which the bottom-up deposition process 1000 is a chemical vapor deposition process, a chlorine containing silicon based precursor can be used to grow the dummy gate material layer 1001 from the interface 1003 of the silicon material of the treated bottom seed structures 91 without growing the dummy gate material layer 1001 from the silicon oxide (e.g., $SiO_2$) material of the dummy gate dielectric layer 73 disposed along the sidewalls of the openings 81. As such, in embodiments where the trenches 61 have an aspect ratio in a range between about 3:1 and about 9:1, the dummy gate material layer 1001 is formed using the bottom-up deposition process 1000 such that the openings 81 are filled and overfilled by the dummy gate material layer 1001 without any voids or seams.

According to some embodiments, the bottom-up deposition process 1000 is performed using a chlorine-containing silicon precursor such as trichlorosilane (TCS), dichlorosilane (DCS), monochlorosilane (MCS), combinations, or the like. Due to the passivation effect of chlorine on silicon oxide ($SiO_2$), the chlorine-containing silicon precursor has a selective growth behavior on silicon as compared to its growth behavior on silicon oxide ($SiO_2$). As such, the silicon film only grows from the bottom seed structures 77 and not from the exposed surfaces of the gate dielectric along sidewalls of the trenches 61 which aids in the bottom-up deposition process 1000. Furthermore, a carrier gas such as hydrogen ($H_2$), nitrogen ($N_2$), combinations or the like may be used to move and carry the precursors for the process. In embodiments which use hydrogen ($H_2$) as the carrier gas, a flow rate of between about 0 slm and about 20 slm is used. In some embodiments, the bottom-up deposition process 1000 is performed using a process temperature of between about 500° C. and about 750° C. and a process pressure of between about 1 Torr and about 300 Torr. However, any suitable process temperatures and pressures may be utilized. Once formed, the dummy gate material layer 1001 may be planarized, such as by a chemical mechanical planarization.

According to some embodiments, the seed layer treatment 900 may be performed to reduce the concentration of impurities in the treated bottom seed structures 91 to a desired level that substantially matches a concentration of impurities expected to be present in the dummy gate material layer 1001 once deposited. For example, a concentration of impurities within the treated bottom seed structures may be within about 0% and about 2% of the concentration of impurities within the dummy gate material layer 1001. As such, the interface 1003 between the treated bottom seed structures 91 and the dummy gate material layer 1001 may be formed as a seamless interface of the dummy gate layer 1005, in accordance with some embodiments. Although the interface 1003 is drawn with a dashed line, in those embodiments of the dummy gate layer 1005 in which the interface 1003 is formed as a seamless interface, there may be no indication of an interface between the treated bottom seed structures 91 and the dummy gate material layer 1001. As such, the dummy gate layer 1005 is formed as a structure that is seamless and voidless.

FIG. 11 is a flowchart of the gap-filling process 1150, according to some embodiments. The gap-filling process 1150 may be performed by initially performing the seed layer deposition process 700 to deposit the bottom layer 75 over the dummy gate dielectric layer 73 and in the trenches 61. Once the bottom layer 75 has been deposited, the seed layer etch process 800 is performed to remove the excess silicon material deposited within and outside of the trenches 61, the remaining material of the bottom layer 75 forming the bottom seed structures 77 and the remaining area of the trenches forming the openings 81. According to some embodiments, the seed layer treatment 900 is performed to remove impurities from the bottom seed structures 77 and to form the treated bottom seed structures 91. Once the treated bottom seed structures 91 have been formed, the dummy gate material layer 1001 is grown from the treated bottom seed structures 91 in the bottom-up deposition process 1000 to fill and overfill the openings 81. According to some embodiments, chlorine-containing silicon precursors such as MCS, DCS, and TCS may be used as a precursor for the deposition of the dummy gate material layer 1001. These chlorine-containing silicon precursors provide superior selective growth behavior on silicon and non-selective growth on silicon dioxide. As such, the dummy gate layer 1005 is formed by the selective growth behavior from the treated bottom seed structures 91 (e.g., Si) and by the non-selective growth behavior along sidewalls of the openings 81 (e.g., $SiO_2$) in a bottom-up manner without any voids being formed within the dummy gate material layer 1001.

Figure 12:
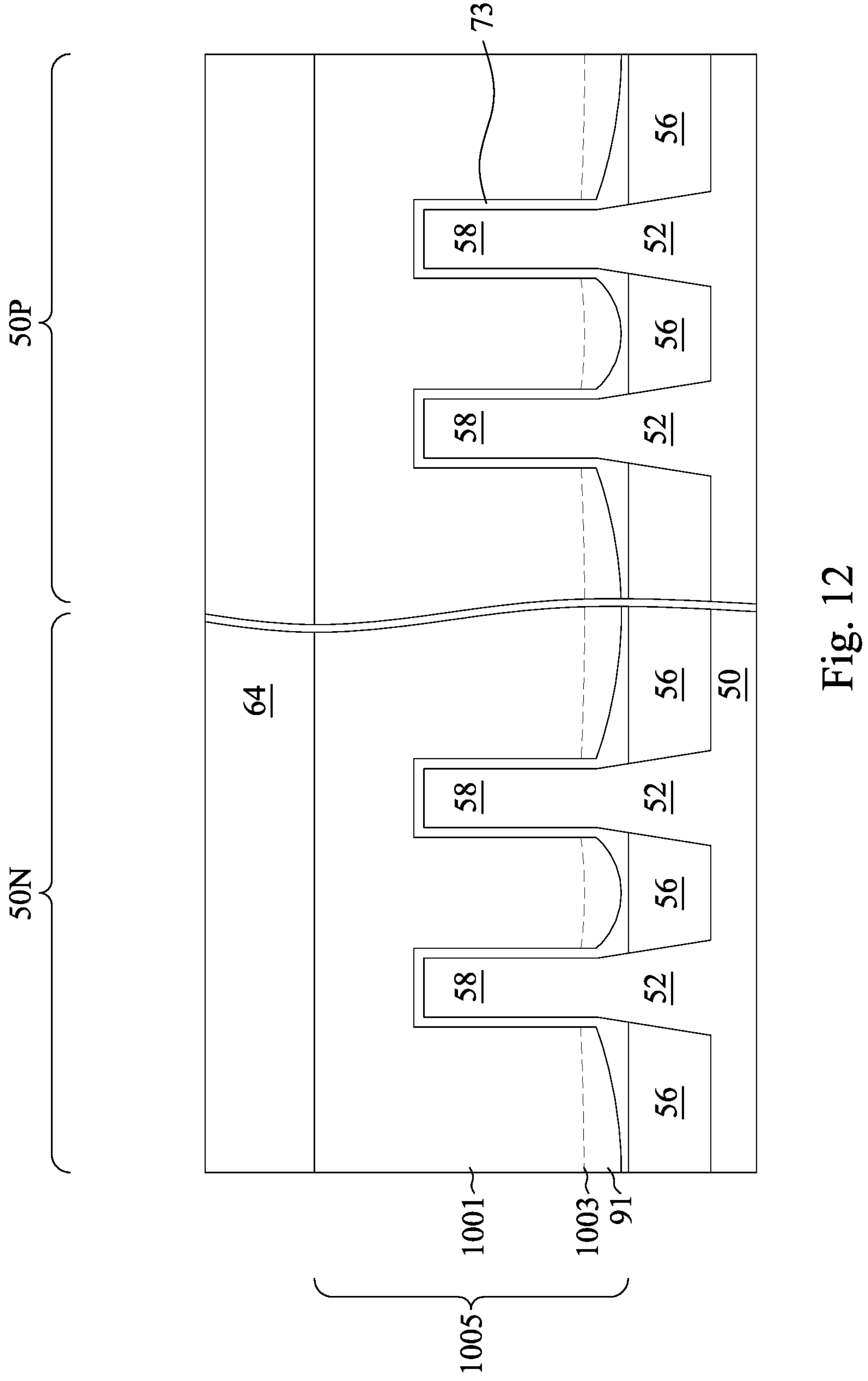
FIGS. 12 through 21B are cross-sectional views of intermediate stages of the manufacturing of the FinFETs, in accordance with some embodiments.

FIG. 12 is a cross-sectional view of an intermediate stage of the manufacturing of the FinFETs, in accordance with some embodiments. FIG. 12 is illustrated with reference to cross-section A-A illustrated in FIG. 1, except for multiple fins/FinFETs. In particular, FIG. 12 illustrates the formation of a mask layer 64, in accordance with some embodiments. Once the dummy gate material layer 1001 has been formed, a mask layer 64 is formed over the dummy gate material layer 1001. The mask layer 64 may include, for example, SiN, SiON, or the like and may be deposited using a physical vapor deposition (PVD), CVD, sputter deposition, or other techniques for depositing the selected material. In this example, the dummy gate material layer 1001, the treated bottom seed structures 91, the dummy gate dielectric layer 73, and a single mask layer 64 are formed across the n-type region 50N and the p-type region 50P. It is noted that the dummy gate dielectric layer 73 is shown covering the fins 52 and the upper surfaces of the isolation regions 56, for illustrative purposes only. In some embodiments, the dummy gate dielectric layer 73 may be deposited such that the dummy gate dielectric layer 73 covers only the channel regions 58 of the fins 52.

Figure 13B:
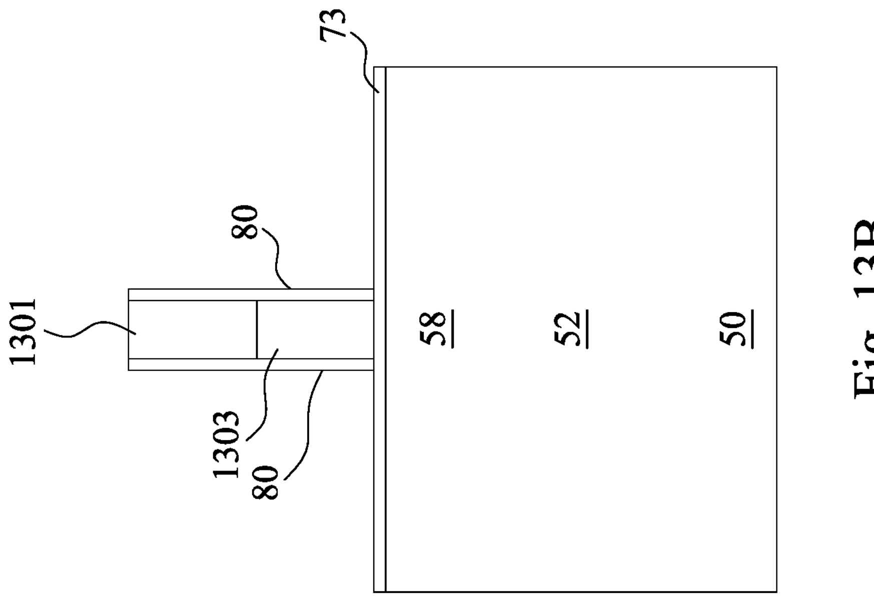
Figure 13A:
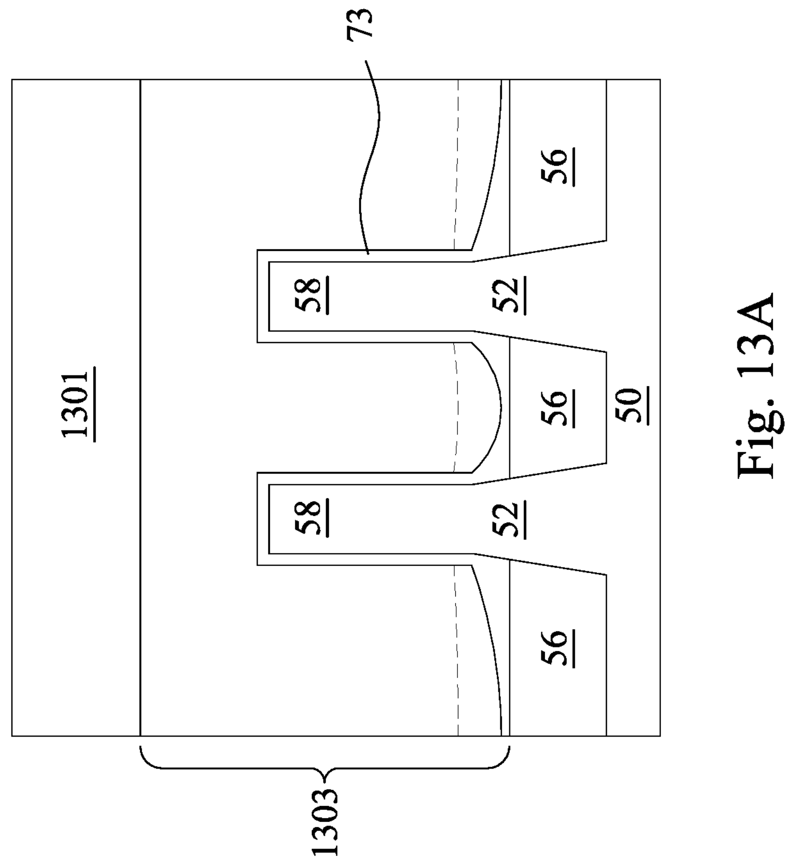
Figure 14B:
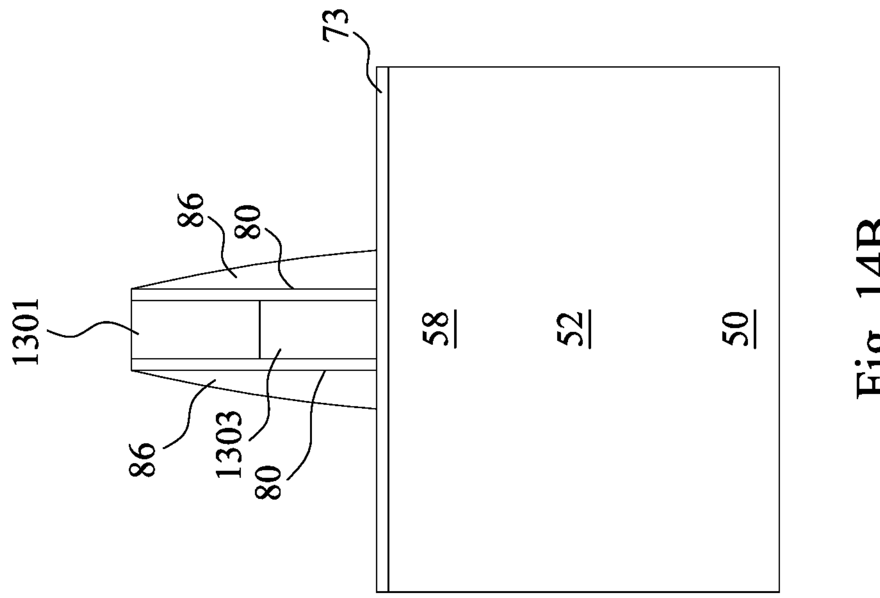

FIG. 13A through 14B illustrate cross-sectional views of further intermediate steps in forming the FinFETs, according to some embodiments. FIGS. 13A and 14A are illustrated along reference cross-section A-A illustrated in FIG. 1, except for multiple fins/FinFETs. FIGS. 13B and 14B are illustrated along a similar cross-section B-B illustrated in FIG. 1, except for multiple fins/FinFETs.

In FIGS. 13A and 13B, the mask layer 64 (shown in FIG. 11) may be patterned using acceptable photolithography and etching techniques to form one or more masks 1301. The pattern of the masks 1301 then may be transferred to the dummy gate layer 1005. In some embodiments (not illustrated), the pattern of the masks 1301 may also be transferred to the dummy gate dielectric layer 73 by an acceptable etching technique to form dummy gate structures 1303. The dummy gate structures 1303 cover respective ones of the channel regions 58 of the fins 52. The pattern of the masks 1301 may be used to physically separate each of the dummy gate structures 1303 from adjacent ones of the dummy gate structures 1303. The dummy gate structures 1303 may also have a lengthwise direction substantially perpendicular to the lengthwise direction of a respective one of the fins 52.

Further in FIGS. 13A and 13B, gate seal spacers 80 can be formed on exposed surfaces of the dummy gate structures 1303, the masks 1301, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 14A:
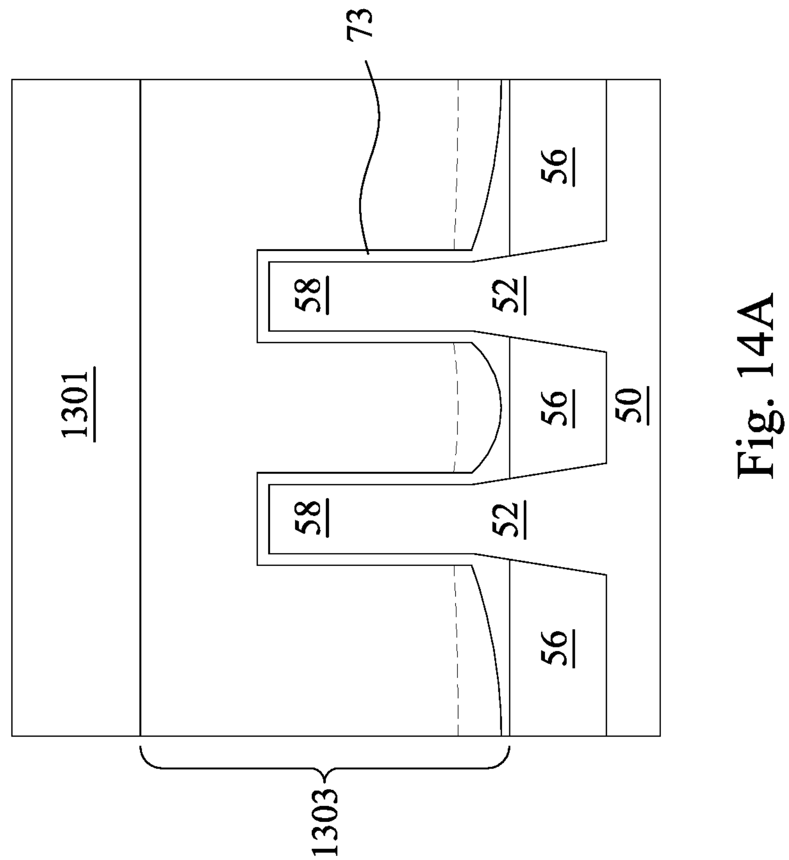

In FIGS. 14A and 14B, gate spacers 86 are formed on the gate seal spacers 80 along sidewalls of the dummy gate structures 1303 and the masks 1301. The gate spacers 86 may be formed by conformally depositing an insulating material and subsequently anisotropically etching the insulating material. The insulating material of the gate spacers 86 may be silicon nitride, SiCN, a combination thereof, or the like.

Figure 15B:
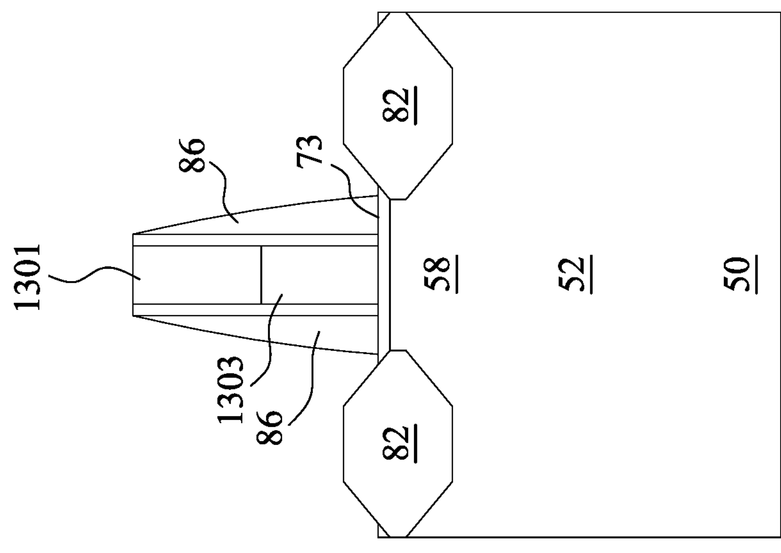
Figure 15A:
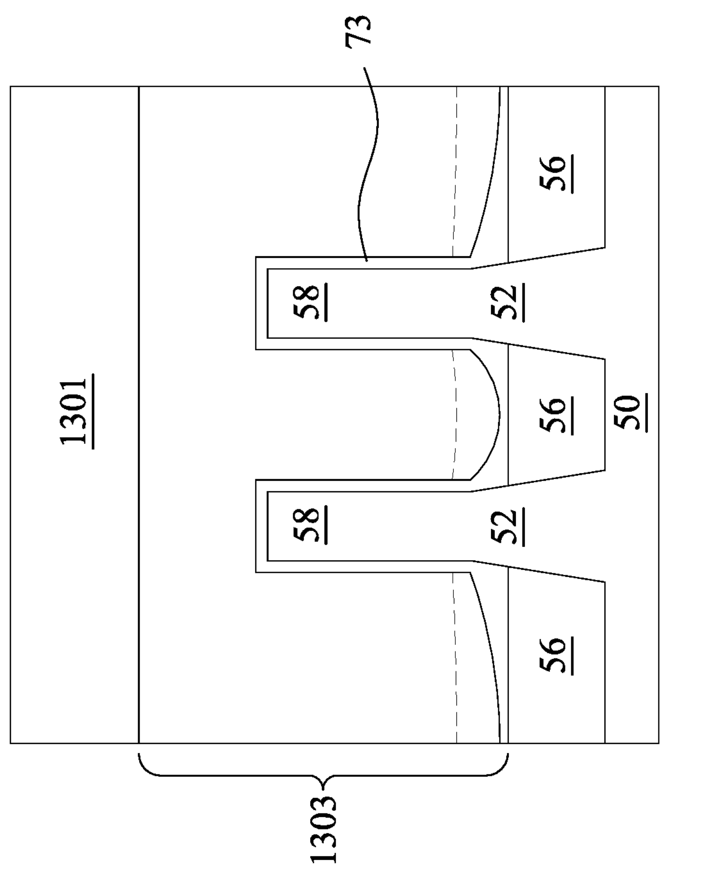

FIGS. 15A and 15B illustrate cross-sectional views of still further intermediate steps in forming the FinFETs, according to some embodiments. Figure is illustrated along reference cross-section A-A illustrated in FIG. 1 and FIG. 15B is illustrated along reference cross-section B-B illustrated in FIG. 1, except for multiple fins/FinFETs. In FIGS. 15A and 15B source/drain regions 82 are formed in the fins 52 to exert stress in the respective ones of the channel regions 58, thereby improving performance. The source/drain regions 82 are formed in the fins 52 such that each of the dummy gate structures 1303 is disposed between respective neighboring pairs of the source/drain regions 82. In some embodiments the source/drain regions 82 may extend into, and may also penetrate through, the fins 52. In some embodiments, the gate spacers 86 are used to separate the source/drain regions 82 from the dummy gate structures 1303 by an appropriate lateral distance so that the source/drain regions 82 do not short out subsequently formed gates of the resulting FinFETs.

The source/drain regions 82 in the n-type region 50N, e.g., the NMOS region, may be formed by masking the p-type region 50P, e.g., the PMOS region, and etching source/drain regions of the fins 52 in the n-type region 50N to form recesses in the fins 52. Then, the source/drain regions 82 in the n-type region 50N are epitaxially grown in the recesses. The source/drain regions 82 may include any acceptable material, such as appropriate for n-type FinFETs.

For example, if the fin 52 is silicon, the source/drain regions 82 in the n-type region 50N may include materials exerting a tensile strain in the channel region 58, such as silicon, SiC, SiCP, SiP, or the like. The source/drain regions 82 in the n-type region 50N may have surfaces raised from respective surfaces of the fins 52 and may have facets.

The source/drain regions 82 in the p-type region 50P, e.g., the PMOS region, may be formed by masking the n-type region 50N, e.g., the NMOS region, and source/drain regions of the fins 52 in the p-type region 50P are etched to form recesses in the fins 52. Then, the source/drain regions 82 in the p-type region 50P are epitaxially grown in the recesses. The source/drain regions 82 may include any acceptable material, such as appropriate for p-type FinFETs. For example, if the fin 52 is silicon, the source/drain regions 82 in the p-type region 50P may comprise materials exerting a compressive strain in the channel region 58, such as SiGe, SiGeB, Ge, GeSn, or the like. The source/drain regions 82 in the p-type region 50P may also have surfaces raised from respective surfaces of the fins 52 and may have facets.

The source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the source/drain regions 82 may be in situ doped during growth.

Figure 15D:
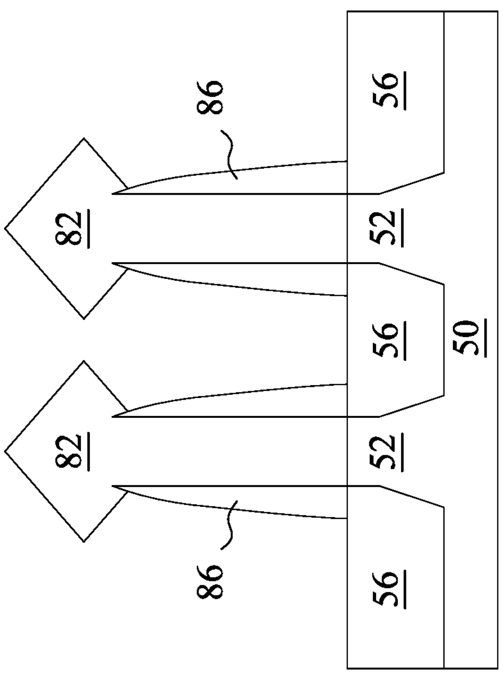
Figure 15C:
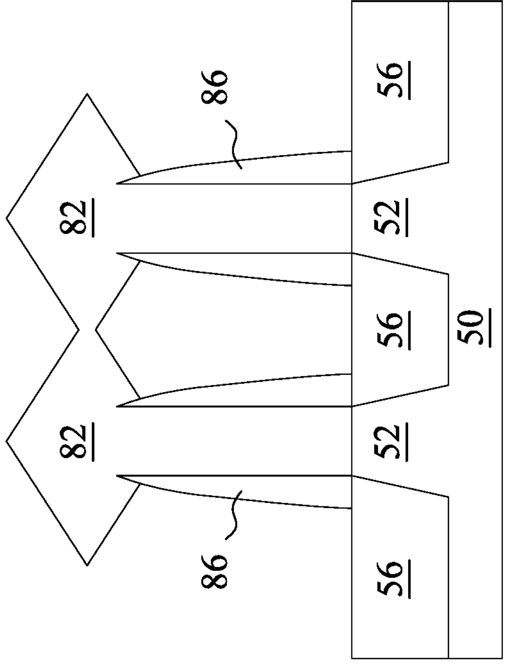

FIGS. 15C and 15D are illustrated along reference cross-section C-C illustrated in FIG. 1, except for multiple fins/FinFETs. In particular, FIGS. 15C and 15D illustrate that, as a result of the epitaxy processes used to form the source/drain regions 82 in the n-type region 50N and the p-type region 50P, upper surfaces of the epitaxial source/drain regions have facets which expand laterally outward beyond sidewalls of the fins 52. In some embodiments, these facets cause adjacent ones of the source/drain regions 82 of a same FinFET to merge as illustrated by FIG. 15C. In other embodiments, adjacent ones of the source/drain regions 82 remain separated after the epitaxy process is completed as illustrated by FIG. 15D.

FIGS. 16A through 21B illustrate cross-sectional views of yet further intermediate steps in forming the FinFETs, according to some embodiments. FIGS. 16A, 17A, 18A, 19A, 20A, and 21A are illustrated along reference cross-section A-A illustrated in FIG. 1, except for multiple fins/FinFETs. FIGS. 16B, 17B, 18B, 19B, 20B, and 21B are illustrated along a similar cross-section B-B illustrated in FIG. 1, except for multiple fins/FinFETs.

Figures 16A, 16B:
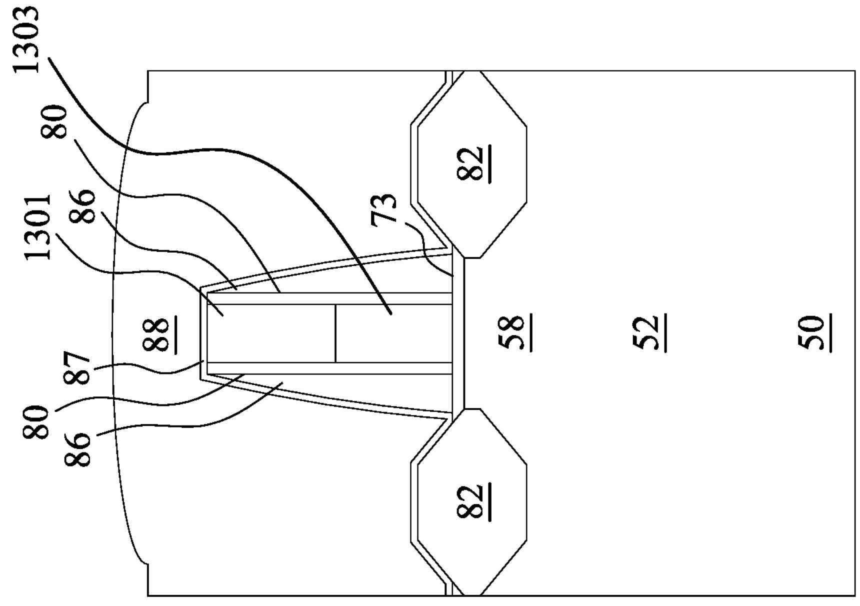

In FIGS. 16A and 16B, a first ILD 88 is deposited over the structure illustrated in FIGS. 15A and 15B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer 87 is disposed between the first ILD 88 and the source/drain regions 82, the masks 1301, and the gate spacers 86. The contact etch stop layer 87 may comprise a dielectric material, such as, silicon nitride, silicon oxide, silicon oxynitride, or the like, having a different etch rate than the material of the first ILD 88.

Figures 17A, 17B:
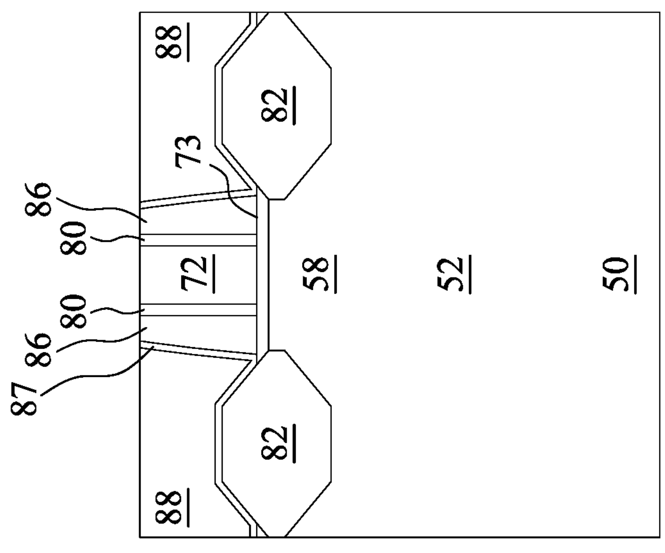

In FIGS. 17A and 17B, a planarization process, such as a chemical mechanical planarization, may be performed to level the top surface of the first ILD 88 with the top surfaces of the dummy gate structures 1303 or the masks 1301. The planarization process may also remove the masks 1301 from over the dummy gate structures 1303, and portions of the gate seal spacers 80 and the gate spacers 86 along sidewalls of the masks 1301. After the planarization process, top surfaces of the dummy gate structures 1303, the gate seal spacers 80, the gate spacers 86, and the first ILD 88 are level. Accordingly, the top surfaces of the dummy gate structures 1303 are exposed through the first ILD 88. In some embodiments, the masks 1301 may remain, in which case the planarization process levels the top surface of the first ILD 88 with the top surfaces of the masks 1301.

Figure 18B:
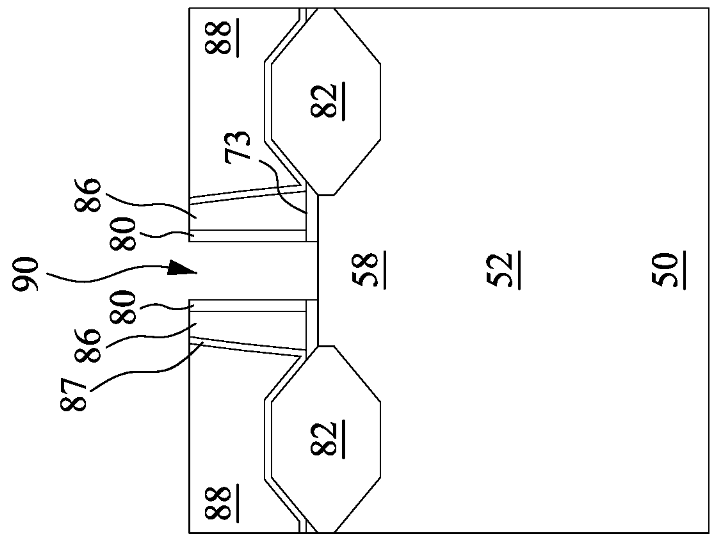
Figure 18A:
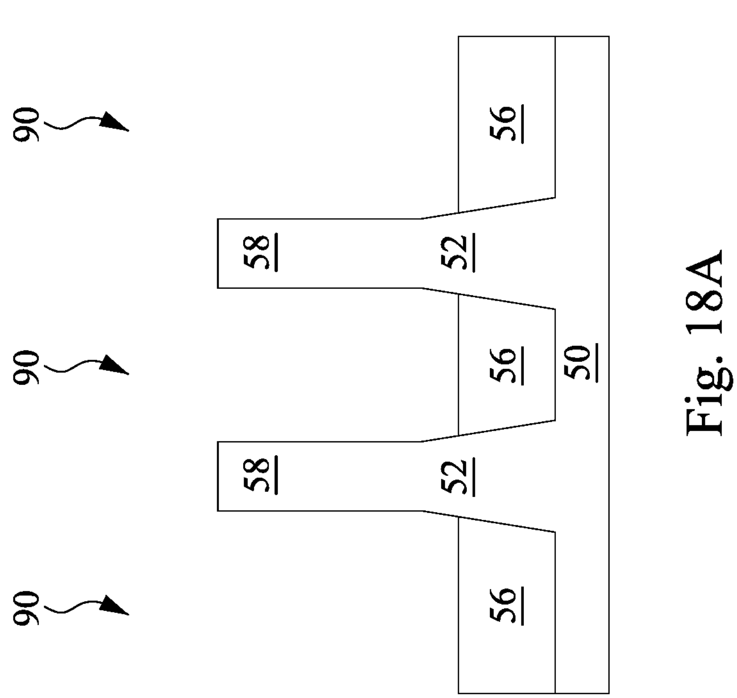

In FIGS. 18A and 18B, the dummy gate structures 1303, and the masks 1301 if present, are removed in an etching step(s), so that recesses 90 are formed. Portions of the dummy gate dielectric layer 73 in the recesses 90 may also be removed. In some embodiments, only the dummy gate structures 1303 are removed and the dummy gate dielectric layer 73 remains and is exposed by the recesses 90. In some embodiments, the dummy gate dielectric layer 73 is removed from recesses 90 in a first region of a die (e.g., a core logic region) and remains in recesses 90 in a second region of the die (e.g., an input/output region). In some embodiments, the dummy gate structures 1303 are removed by an anisotropic dry etch process. For example, the etching process may include a dry etch process using reaction gas(es) that selectively etch the dummy gate structures 1303 without etching the first ILD 88 or the gate spacers 86. Each recess 90 exposes a channel region 58 of a respective one of the fins 52. Each channel region 58 is disposed between neighboring pairs of the source/drain regions 82. During the removal, the dummy gate dielectric layer 73 may be used as an etch stop layer when the dummy gate structures 1303 are etched. The dummy gate dielectric layer 73 may then be optionally removed after the removal of the dummy gate structures 1303.

Figure 19B:
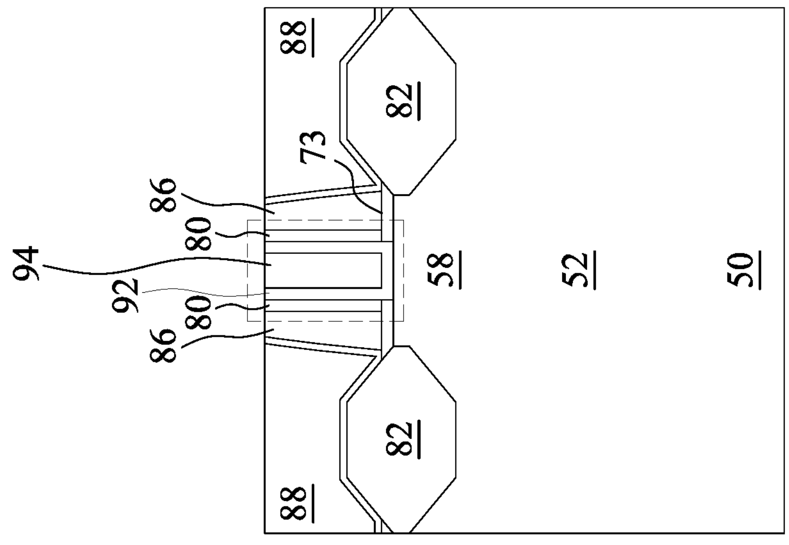
Figure 19A:
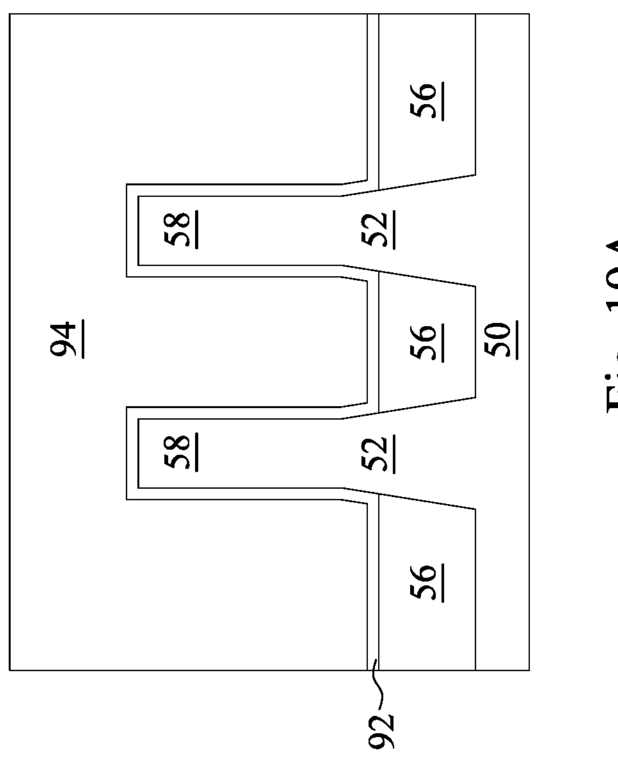
Figure 19C:
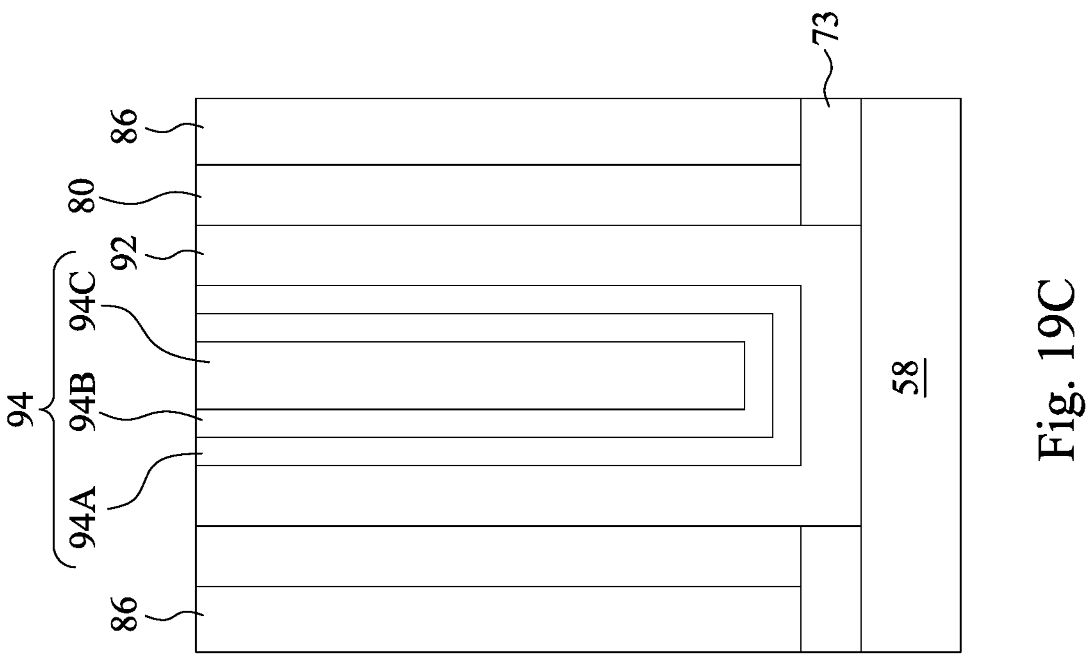

In FIGS. 19A and 19B, gate dielectric layers 92 and gate electrodes 94 are formed for replacement gates. FIG. 19C illustrates a detailed view of a second section 89 of FIG. 19B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy gate dielectric layer 73 remains in the recesses 90, the gate dielectric layers 92 include a material of the dummy gate dielectric layer 73 (e.g., $SiO_2$).

The gate electrodes 94 are deposited over the gate dielectric layers 92, respectively, and fill the remaining portions of the recesses 90. The gate electrodes 94 may include a metal-containing material such as TiN, TiO, TaN, TaC, Co, Ru, Al, W, combinations thereof, or multi-layers thereof. After the filling of the gate electrodes 94, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52. FIG. 19B further illustrates the second section 89 highlighted by a dashed line.

FIG. 19C illustrates a magnified view of the second section 89 highlighted in FIG. 19B, according to some embodiments. Although a single layer is illustrated for the gate electrode 94 in FIG. 19B, the gate electrode 94 may comprise any number of liner layers 94A, any number of work function tuning layers 94B, and a fill material 94C as illustrated by FIG. 19C.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 20B:
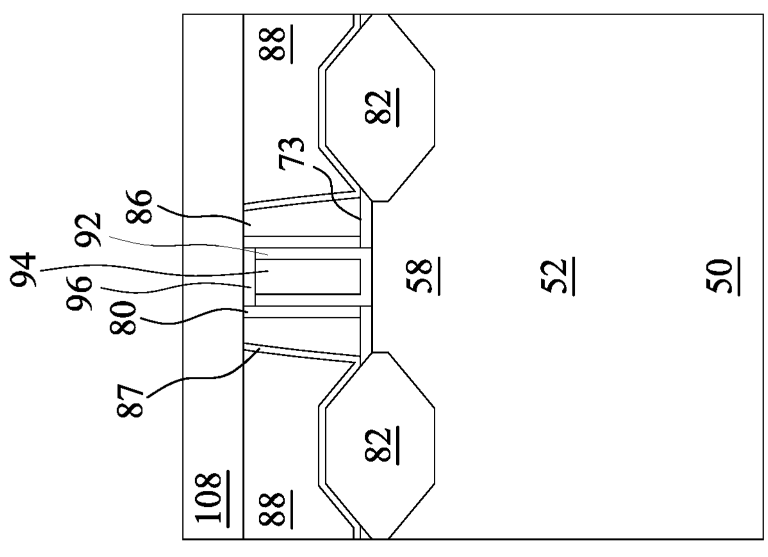
Figure 20A:
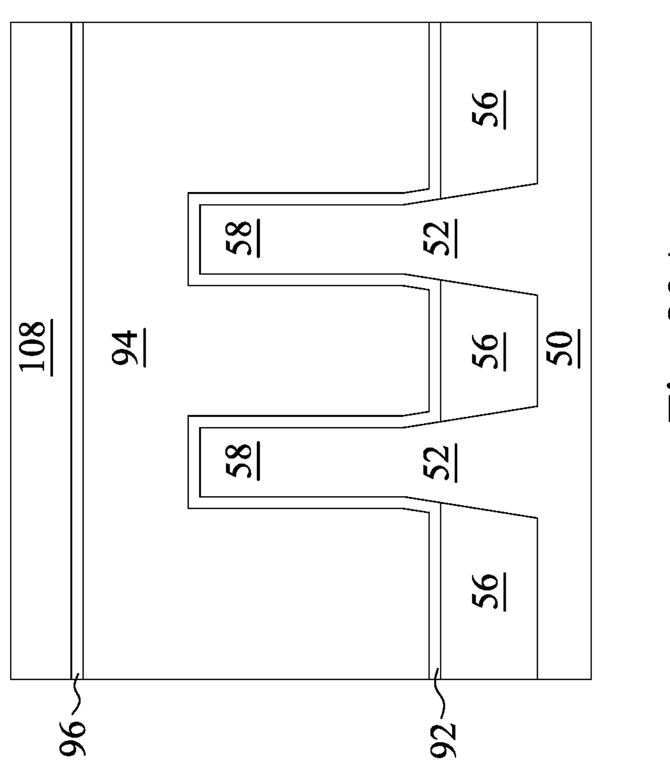

In FIGS. 20A and 20B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including corresponding ones of the gate dielectric layer 92 and the gate electrode 94) is recessed, so that a recess is formed directly over the gate stack and between opposing portions of gate spacers 86, as illustrated in FIGS. 20A and 20B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts no (FIGS. 21A and 21B) penetrate through the gate mask 96 to contact the top surface of the recessed gate electrode 94.

Figure 21B:
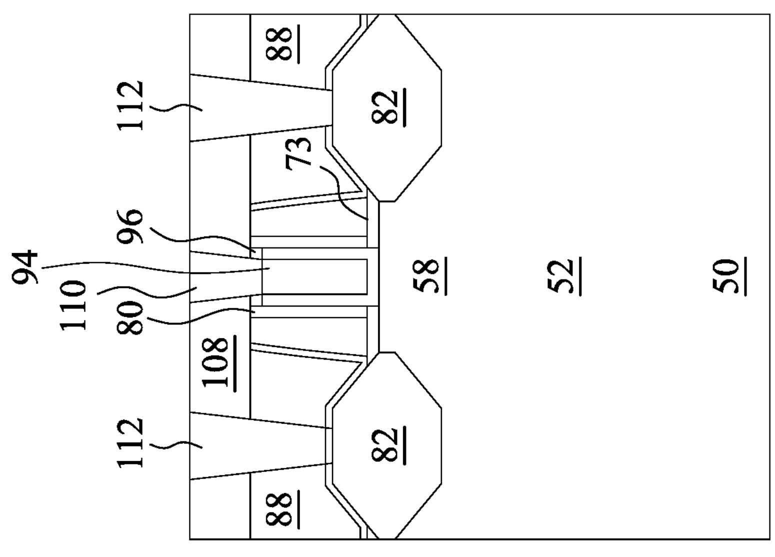
Figure 21A:
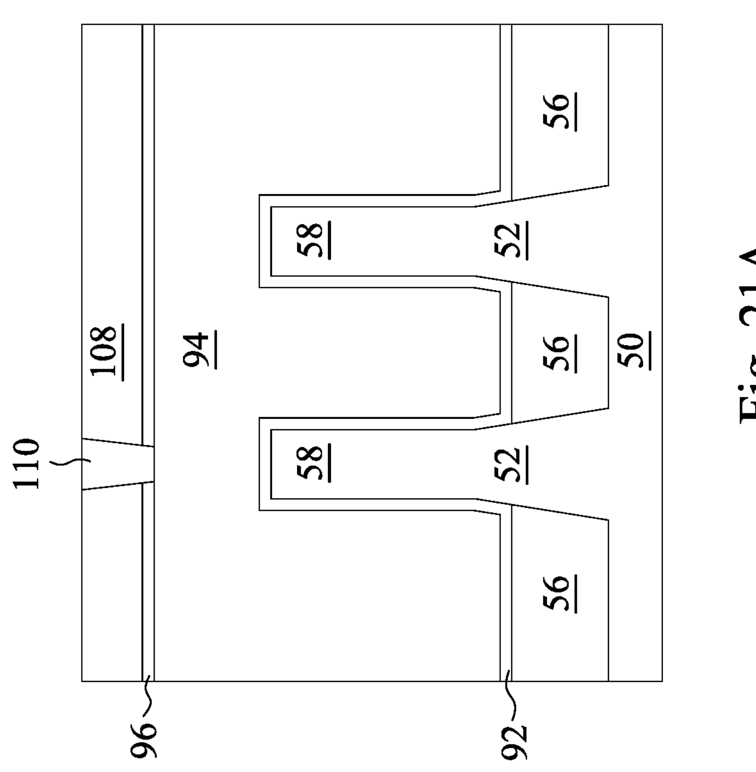

In FIGS. 21A and 21B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and the gate contacts 110 in the openings. An anneal process may be performed to form a silicide at the interface between the epitaxial growth of the source/drain regions 82 and the source/drain contacts 112. The source/drain contacts 112 are physically and electrically coupled to the source/drain regions 82, and the gate contacts 110 are physically and electrically coupled to the gate electrodes 94. The source/drain contacts 112 and the gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Embodiments such as those discussed herein include a method of forming a silicon material such as a silane-based material layer and the resulting structure. Generally, the embodiments include a process of forming a trench and fins in a substrate, forming an oxide layer in the trench, depositing a first flowable silicon material in the trench, etching the first flowable silicon material to form a bottom structure in the trench, treating the bottom structure, and performing a bottom-up deposition using a second flowable silicon material in the trench and over the bottom structure. In some embodiments, the treatment allows for a seamless structure to be formed within the trench and the bottom-up deposition allows for a voidless structure to be formed within the recess. In some embodiments, processes such as those discussed herein may exhibit fewer issues, such as the formation of seams and voids during trench gap-filling due to the fins bending and/or high aspect ratio trenches.

According to some embodiments, a method includes: forming a recess between fins in a substrate; forming a dielectric layer over the fins and in the recess; forming a bottom seed structure in the recess; and growing a dummy gate material from the bottom seed structure without growing the dummy gate material from the dielectric layer. In an embodiment of the method, forming the bottom seed structure includes using a higher order silane as a precursor; condensing the higher order silane into a flowable silicon film; and depositing the flowable silicon film in the recess. In an embodiment the forming the bottom seed structure further includes removing a seed layer from sidewalls of the recess. In an embodiment the growing the dummy gate material fills the recess with the dummy gate material without forming a void in the dummy gate material. In an embodiment the method further includes, prior to the growing the dummy gate material, removing impurities from the bottom seed structure by treating the bottom seed structure. In an embodiment of the method, growing the dummy gate material includes using a chlorine-containing silicon precursor. In an embodiment of the method, the chlorine-containing silicon precursor is trichlorosilane.

In accordance with some embodiments, a method includes: forming a trench between fins in a substrate; forming a gate dielectric material at a bottom and along sidewalls of the trench; depositing a first silicon material over the gate dielectric material; exposing the gate dielectric material along the sidewalls of the trench by etching the first silicon material; and performing a bottom-up deposition of a second silicon material over the first silicon material. In an embodiment the depositing the first silicon material includes using, at least in part, a first flowable material. In an embodiment the performing the bottom-up deposition includes using a second flowable material, the second flowable material being different from the first flowable material.

In an embodiment using the first flowable material includes using cyclopentasilane and wherein using the second flowable material includes using dichlorosilane. In an embodiment the method further includes, prior to performing the bottom-up deposition, performing a treatment on the first silicon material that modifies a first material composition of the first silicon material. In an embodiment the performing the treatment reduces a concentration of hydrogen in the first silicon material. In an embodiment of the method, the treatment is performed using a process temperature within a range of 400° C. and 1000° C.

According to another embodiment, a system includes: a chamber to house a substrate; a first precursor delivery system; a precursor controller connected between the first precursor delivery system and the chamber; a heating element adjacent to an inlet of the chamber; and a cooling element adjacent to the chamber, wherein the cooling element is located to cool a first precursor from the first precursor delivery system to condense the first precursor into a trench between fins on the substrate. In an embodiment the heating element is also adjacent to an outlet of the chamber. In an embodiment, the system further includes an injection unit including a first end coupled to the inlet of the chamber to receive the first precursor in a gaseous phase and a second end located adjacent to the cooling element to release the first precursor adjacent to the cooling element. In an embodiment, the first end of the injection unit is also located adjacent to the heating element. In an embodiment the first precursor includes a higher order silane precursor. In an embodiment, the system further includes a second precursor delivery system connected to the chamber by the precursor controller, wherein the injection unit is coupled to the inlet of the chamber also to receive a second precursor from the second precursor delivery system in a gaseous phase and to release the second precursor adjacent to the cooling element located to cool and condense the second precursor into the trench, wherein the second precursor includes a chlorine-containing silicon precursor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a recess between fins in a substrate;

a dielectric layer over the fins and along a bottom of the recess, wherein the dielectric layer has a first thickness over the fins and a second thickness 5 to 100 times greater than the first thickness at the bottom of the recess;

a bottom seed structure at the bottom of the recess directly on the dielectric layer; and a dummy gate material extending from the bottom seed structure to a top of the recess.

2. The device of claim 1, wherein the bottom seed structure is a silicon film.

3. The device of claim 1, wherein the dielectric layer is SiO.

4. The device of claim 1, wherein the dummy gate material is absent of any voids from the bottom seed structure to the top of the recess.

5. The device of claim 1, wherein the recess has an aspect ratio in a range of 3:1 to 9:1.

6. The device of claim 1, wherein the dummy gate material has a first concentration of impurities and the bottom seed structure has a second concentration of impurities, the second concentration of impurities being in a range of 0% to 2% of the first concentration of impurities.

7. The device of claim 6, wherein the second concentration of impurities comprises hydrogen.

8. A semiconductor device comprising:

a trench between fins in a semiconductor substrate;

a gate dielectric material along a bottom of the trench and over the fins, wherein the gate dielectric material has a first thickness at the bottom of the trench and a second thickness over the fins, wherein the first thickness is greater than the second thickness;

a first silicon material over the gate dielectric material; and a second silicon material over the first silicon material, wherein the second silicon material completely fills the trench without any voids in the second silicon material.

9. The device of claim 8, wherein an interface between the first silicon material and the second silicon material is seamless.

10. The device of claim 8, wherein the first silicon material is a silicon film.

11. The device of claim 8, wherein the gate dielectric material comprises SiON.

12. The device of claim 8, wherein the first silicon material has a first concentration of impurities and the second silicon material has a second concentration of impurities, the first concentration of impurities being in a range of 0% to 2% of the second concentration of impurities.

13. The device of claim 12, wherein the first concentration of impurities comprises hydrogen.

14. The device of claim 8, wherein the trench has an aspect ratio in a range of 3:1 to 9:1.

15. A semiconductor device comprising:

a structure having a trench extending into the structure from an upper surface of the structure;

a gate dielectric material layer along sidewalls and along a bottom of the trench, wherein the gate dielectric material layer has a first thickness at the bottom of the trench and a second thickness over the upper surface of the structure, wherein the first thickness is greater than the second thickness;

a first silicon material layer over the gate dielectric material layer; and a second silicon material layer over the first silicon material layer, wherein the second silicon material layer completely fills remaining portions of the trench without any voids in the second silicon material layer.

16. The semiconductor device of claim 15, wherein a concentration of impurities in the first silicon material layer is within 0% to 2% of a concentration of impurities in the second silicon material layer.

17. The semiconductor device of claim 16, wherein the impurities comprise hydrogen.

18. The semiconductor device of claim 15, wherein the structure includes two fin structures, wherein the trench is between the two fin structures, wherein the gate dielectric material layer, the first silicon material layer, and the second silicon material layer form a dummy gate structure.

19. The semiconductor device of claim 15, wherein the first silicon material layer has a thickness along the bottom of the trench between 0.5 nm and 50 nm.

20. The semiconductor device of claim 15, wherein the first silicon material layer is thinner along the sidewalls of the trench than along a bottom of the trench.

* * * * *